US008751769B2

(12) United States Patent
Mansour

(10) Patent No.: US 8,751,769 B2
(45) Date of Patent: Jun. 10, 2014

(54) EFFICIENT ADDRESS GENERATION FOR PRUNED INTERLEAVERS AND DE-INTERLEAVERS

(75) Inventor: Mohammad Mansour, Beirut (LB)

(73) Assignee: QUALCOMM Incorporated, San Diego, CA (US)

( * ) Notice: Subject to any disclaimer, the term of this patent is extended or adjusted under 35 U.S.C. 154(b) by 748 days.

(21) Appl. No.: 12/336,167

(22) Filed: Dec. 16, 2008

(65) Prior Publication Data

US 2009/0164748 A1 Jun. 25, 2009

Related U.S. Application Data

(60) Provisional application No. 61/016,045, filed on Dec. 21, 2007.

(51) Int. Cl.
*G06F 12/00* (2006.01)
*G06F 13/16* (2006.01)
*G06F 12/06* (2006.01)

(52) U.S. Cl.
CPC ........ *G06F 13/1647* (2013.01); *G06F 12/0607* (2013.01)
USPC ............... 711/202; 711/200; 711/157; 711/5; 711/217; 711/E21.079

(58) Field of Classification Search
CPC ..................... G06F 12/0607; G06F 13/1647
See application file for complete search history.

(56) References Cited

U.S. PATENT DOCUMENTS

| 8,599,764 | B2 | 12/2013 | Vijayan et al. |
| 2004/0114596 | A1 | 6/2004 | Ha et al. |
| 2006/0242476 | A1 | 10/2006 | Bickerstaff et al. |

FOREIGN PATENT DOCUMENTS

| CN | 1345486 A | 4/2002 |
| EP | 1418675 A2 | 5/2004 |
| JP | 2003032125 A | 1/2003 |
| JP | 2005505947 A | 2/2005 |
| JP | 2006504376 A | 2/2006 |
| KR | 20040037624 A | 5/2004 |
| WO | WO0059117 | 10/2000 |
| WO | WO0035103 | 12/2001 |
| WO | WO-2005043794 | 5/2005 |

OTHER PUBLICATIONS

3GPP2 C.S0084-001-0 v1.0; "3rd Generation Partnership Project 2; Physical Layer for Ultra Mobile Broadband (UMB) Air Interface Specification," 3GPP2 C.S0084-001-0 version 1.0, Apr. 5, 2007.
International Search Report/Written Opinion—PCT/US08/087276—International Search Authority EPO—Dec. 16, 2009.
Taiwan Search Report—TW097149906—TIPO—Oct. 28, 2012.
TIA: "Forward Link Only Air Interface Specification Rev. 1.1" Internet Citation, FLO Forum Technical Contribution to TR47, Dec. 22, 2005, pp. 1-164, XP002387062, Retrieved from the Internet: URL: http://ftp.tiaonline.org/TR-47/TR471/Working/20060110-Arlington-meeting1/TR471-20060110-004a_FLO%20AIS.pdf>.

*Primary Examiner* — Matthew Bradley
*Assistant Examiner* — Arvind Talukdar
(74) *Attorney, Agent, or Firm* — Eric Ho

(57) ABSTRACT

Techniques for efficiently generating addresses for pruned interleavers and pruned de-interleavers are described. In an aspect, a linear address may be mapped to an interleaved address for a pruned interleaver by determining the total number of invalid mappings corresponding to the linear address. The linear address may be summed with the total number of invalid mappings to obtain an intermediate address. The interleaved address for the pruned interleaver may then be determined based on a non-pruned interleaver function of the intermediate address. The pruned interleaver may be a pruned bit-reversal interleaver, a pruned Turbo interleaver composed of a bit-reversal function and a linear congruential sequence function, or some other type of interleaver. The total number of invalid mappings may be determined iteratively, and each iteration may be performed in different manners for different types of pruned interleaver.

39 Claims, 10 Drawing Sheets

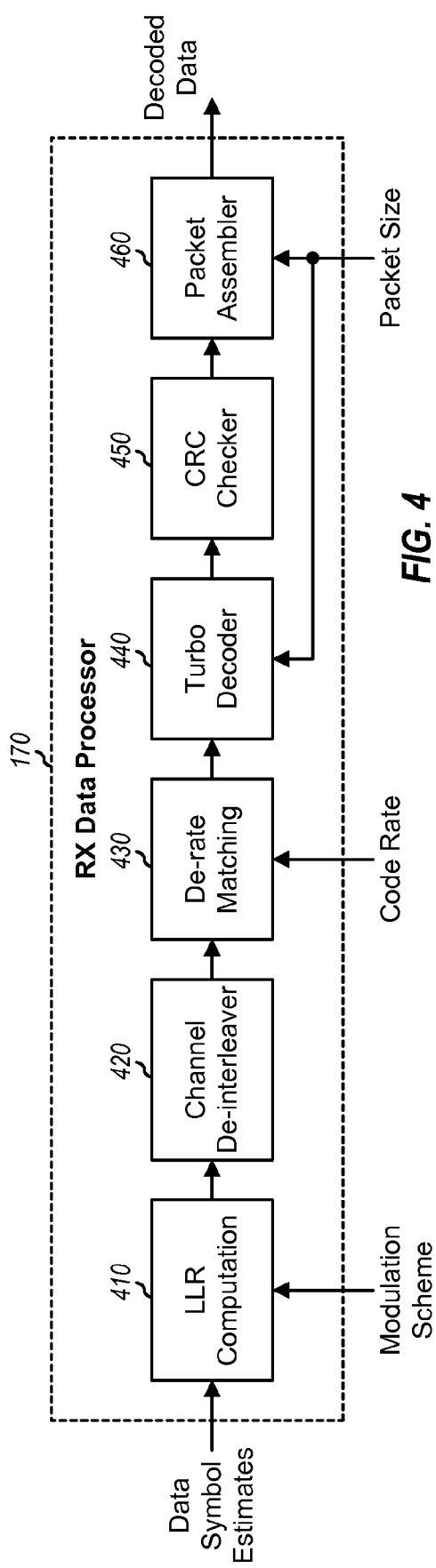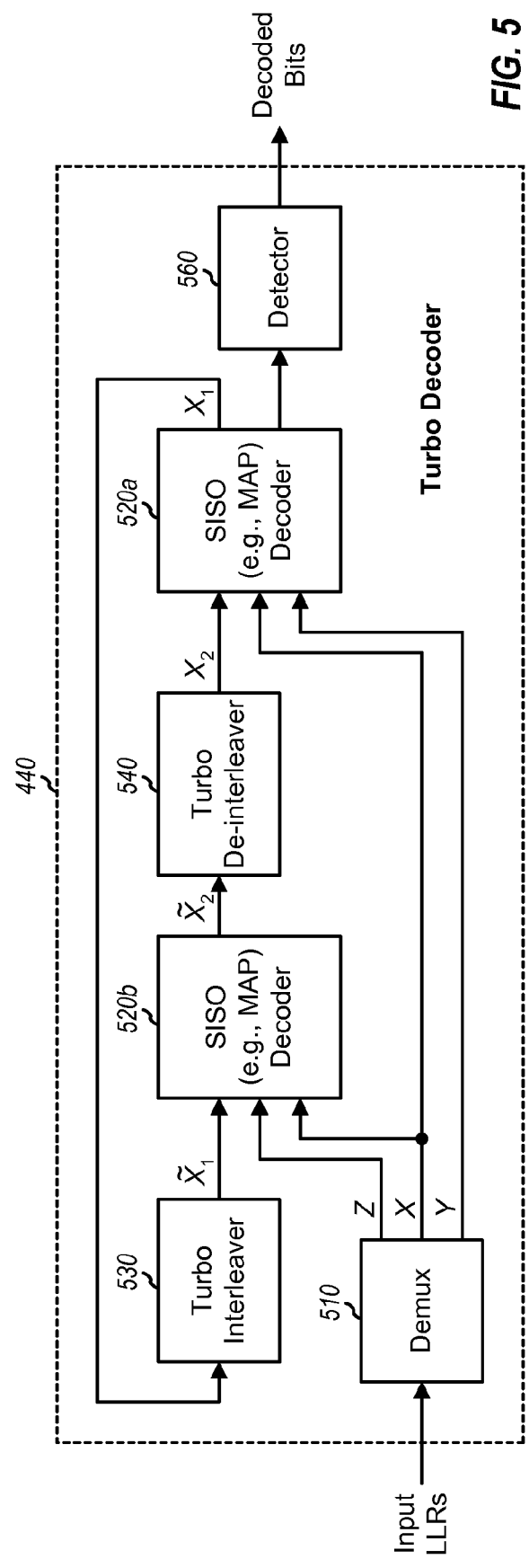

US 8,751,769 B2

EFFICIENT ADDRESS GENERATION FOR PRUNED INTERLEAVERS AND DE-INTERLEAVERS

CLAIM OF PRIORITY UNDER 35 U.S.C. §119

The present Application for Patent claims priority to Provisional U.S. Application Ser. No. 61/016,045, entitled "PARALLEL PRUNED INTERLEAVER METHOD AND APPARATUS," filed Dec. 21, 2007, assigned to the assignee hereof, and expressly incorporated herein by reference.

BACKGROUND

I. Field

The present disclosure relates generally to data processing, and more specifically to interleavers and de-interleavers.

II. Background

An interleaver is a functional block that receives input data, shuffles or re-orders the input data, and provides the shuffled data as output data. Interleavers are employed in most wireless communication systems to reduce the impact of noise and interference on performance. For example, channel interleaving is commonly utilized to protect against a burst of errors due to noise and interference. At a transmitter, a channel interleaver shuffles code bits from a channel encoder so that consecutive code bits are spread apart in the interleaved bits. When a sequence of interleaved bits is involved in a burst of errors, these interleaved bits are spread apart after the complementary re-shuffling by a channel de-interleaver at a receiver. Thus, interleaving breaks temporal correlation between successive bits involved in a burst of errors, which may improve performance.

Interleaving may be performed by receiving a data value (e.g., a code bit) at a particular linear address, determining an interleaved address based on the linear address, and storing the data value at the interleaved address. The mapping from the linear address to the interleaved address may be based on a look-up table. A number of packet sizes may be supported, and a look-up table may be generated for each supported packet size. A large amount of memory may then be required to store many look-up tables for mapping linear addresses to interleaved addresses for many different packet sizes. It may thus be desirable to efficiently compute interleaved addresses in real time as needed.

SUMMARY

Techniques for efficiently determining addresses for pruned interleavers and pruned de-interleavers are described herein. Non-pruned interleavers and non-pruned de-interleavers have sizes that are powers of two, so that an entire address range from 0 to M−1 is valid, where $M=2^n$ and n is the number of bits for addresses. Pruned interleavers and pruned de-interleavers have sizes that are not powers of two, so that addresses within a range of L to M−1 are invalid, where L is the size of a pruned interleaver or de-interleaver.

In an aspect, a linear address may be mapped to an interleaved address for a pruned interleaver by determining the total number of invalid mappings corresponding to the linear address. An invalid mapping is a mapping of a linear address to an interleaved address that is not within a range of 0 to L−1 based on a non-pruned interleaver function. The linear address may be summed with the total number of invalid mappings to obtain an intermediate address. The interleaved address for the pruned interleaver may then be determined based on the non-pruned interleaver function of the intermediate address.

In one design, the pruned interleaver may be a pruned bit-reversal interleaver (BRI). A bit-reversed version of the intermediate address may be provided as the interleaved address for the pruned BRI. In another design, the pruned interleaver may be a pruned Turbo interleaver comprising a bit-reversal function for a plurality of rows of a 2-dimensional (2D) array and a linear congruential sequence (LCS) function for a plurality of entries in each row. The interleaved address for the pruned Turbo interleaver may be determined based on a non-pruned Turbo interleaver function of the intermediate address.

In one design, the total number of invalid mappings may be determined iteratively, e.g., for a predetermined number of iterations or until the same total number of invalid mappings is obtained for two consecutive iterations. Each iteration may be performed in different manners for different types of pruned interleaver, as described below.

In another aspect, an interleaved address may be mapped to a linear address for a pruned de-interleaver by determining the total number of invalid mappings corresponding to the interleaved address. An intermediate address may be determined based on a non-pruned de-interleaver function of the interleaved address. The total number of invalid mappings may then be subtracted from the intermediate address to obtain the linear address for the pruned de-interleaver.

Various aspects and features of the disclosure are described in further detail below.

BRIEF DESCRIPTION OF THE DRAWINGS

FIG. 4 shows a block diagram of a receive (RX) data processor.

FIG. 5 shows a block diagram of a Turbo decoder.

DETAILED DESCRIPTION

The techniques described herein may be used for various applications such as communication, networking, computing, etc. For example, the techniques may be used for wireless communication systems such as Code Division Multiple Access (CDMA), Time Division Multiple Access (TDMA), Frequency Division Multiple Access (FDMA), Orthogonal FDMA (OFDMA), Single-Carrier FDMA (SC-FDMA) and other systems. The terms "system" and "network" are often used interchangeably. A CDMA system may implement a radio technology such as cdma2000, Universal Terrestrial Radio Access (UTRA), etc. cdma2000 covers IS-2000, IS-95 and IS-856 standards. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM®, etc. UTRA, E-UTRA and GSM are part of Universal Mobile Telecommunication System (UMTS). 3GPP Long Term Evolution (LTE) is an upcoming release of UMTS that uses E-UTRA. UTRA, E-UTRA, GSM, UMTS and LTE are described in documents from an organization named "3rd Generation Partnership Project" (3GPP). cdma2000 and UMB are described in documents from an organization named "3rd Generation Partnership Project 2" (3GPP2). For clarity, certain aspects of the techniques are described below for UMB.

The techniques described herein may be used for a terminal as well as a base station. A terminal may also be referred to as a mobile station, a user equipment, an access terminal, a subscriber unit, a station, etc. A terminal may be a cellular phone, a personal digital assistant (PDA), a wireless communication device, a wireless modem, a handheld device, a laptop computer, a cordless phone, a wireless local loop (WLL) station, etc. A base station may also be referred to as a Node B, an evolved Node B (eNB), an access point, etc.

Figure 1:
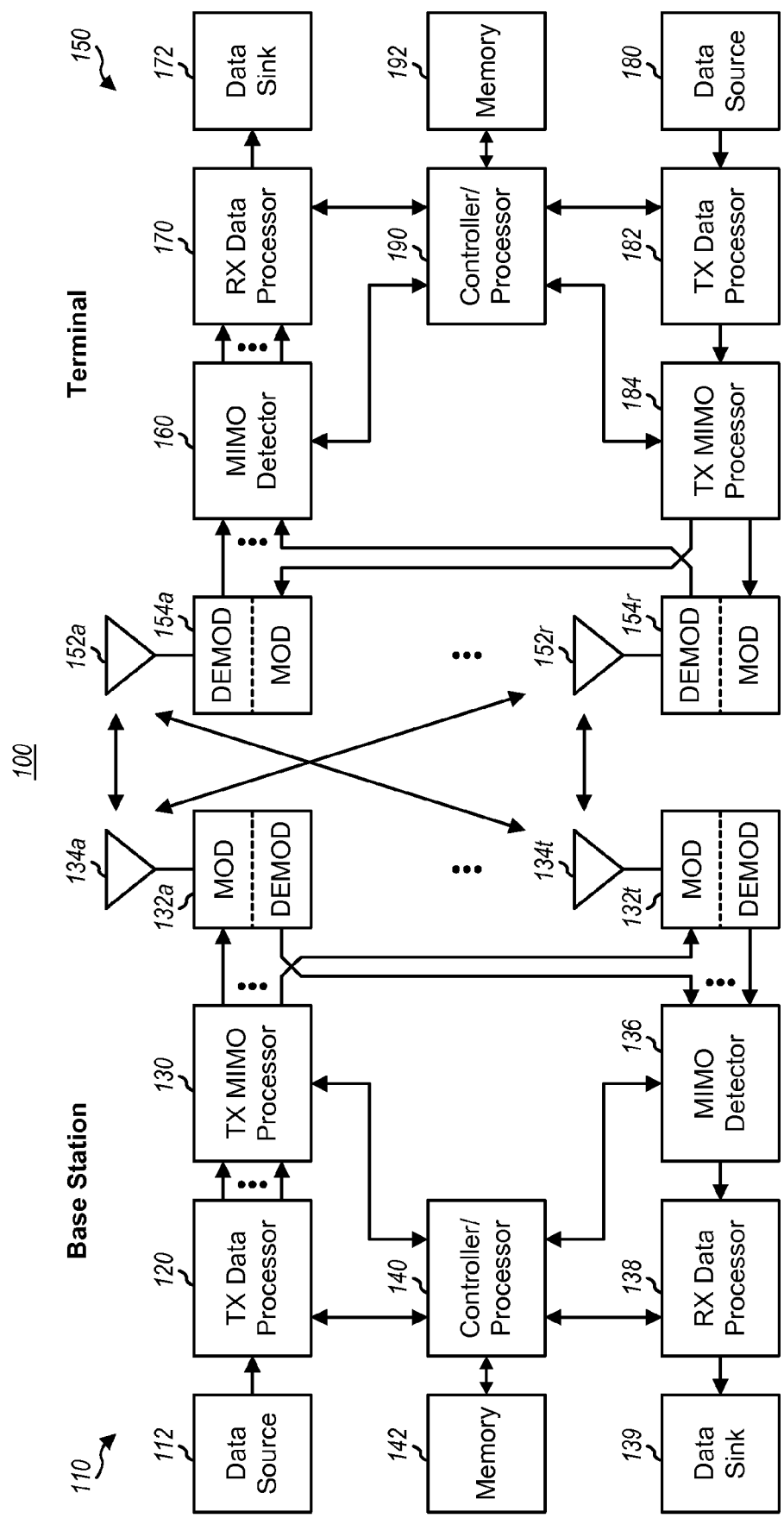
FIG. 1 shows a block diagram of a base station and a terminal.

FIG. 1 shows a block diagram of a design of a base station 110 and a terminal 150 in a wireless communication system. Base station 110 is equipped with T antennas, and terminal 150 is equipped with R antennas, where in general $T \geq 1$ and $R \geq 1$.

At base station 110, a TX data processor 120 may receive data from a data source 112, process (e.g., encode, interleave, and modulate) the data based on a packet format, and provide data symbols. The packet format may indicate a packet size, a modulation and coding scheme (MCS), etc. The packet format may also be referred to as a rate, a transport format, etc. A TX multiple-input multiple-output (MIMO) processor 130 may multiplex the data symbols with pilot symbols and may perform precoding (e.g., for beamforming) if applicable. Processor 130 may provide T output symbol streams to T modulators (MOD) 132a through 132t. Each modulator 132 may process its output symbol stream (e.g., for OFDM, SC-FDM, CDMA, etc.) to obtain an output sample stream. Each modulator 132 may further condition (e.g., convert to analog, filter, amplify, and upconvert) its output sample stream and generate a forward link signal. T forward link signals from modulators 132a through 132t may be transmitted from T antennas 134a through 134t, respectively.

At terminal 150, R antennas 152a through 152r may receive the forward link signals, and each antenna 152 may provide a received signal to a respective demodulator (DEMOD) 154. Each demodulator 154 may process (e.g., filter, amplify, downconvert, and digitize) its received signal to obtain samples and may further process the samples (e.g., for OFDM, SC-FDM, CDMA, etc.) to obtain received symbols. A MIMO detector 160 may perform MIMO detection on received data symbols with a channel estimate derived from received pilot symbols and provide data symbol estimates. An RX data processor 170 may further process (e.g., demodulate, de-interleave, and decode) the data symbol estimates and provide decoded data to a data sink 172.

At terminal 150, data from a data source 180 may be processed by a TX data processor 182, multiplexed with pilot symbols and processed by a TX MIMO processor 184, and further processed by modulators 154a through 154r to generate R reverse link signals, which may be transmitted via antennas 152a through 152r. At base station 110, the reverse link signals may be received by T antennas 134a through 134t, processed by demodulators 132a through 132t, detected by a MIMO detector 136, and further processed by an RX data processor 138 to recover the data sent by terminal 150.

Controllers/processors 140 and 190 may direct the operation at base station 110 and terminal 150, respectively. Memories 142 and 192 may store data and program codes for base station 110 and terminal 150, respectively.

Figure 2:
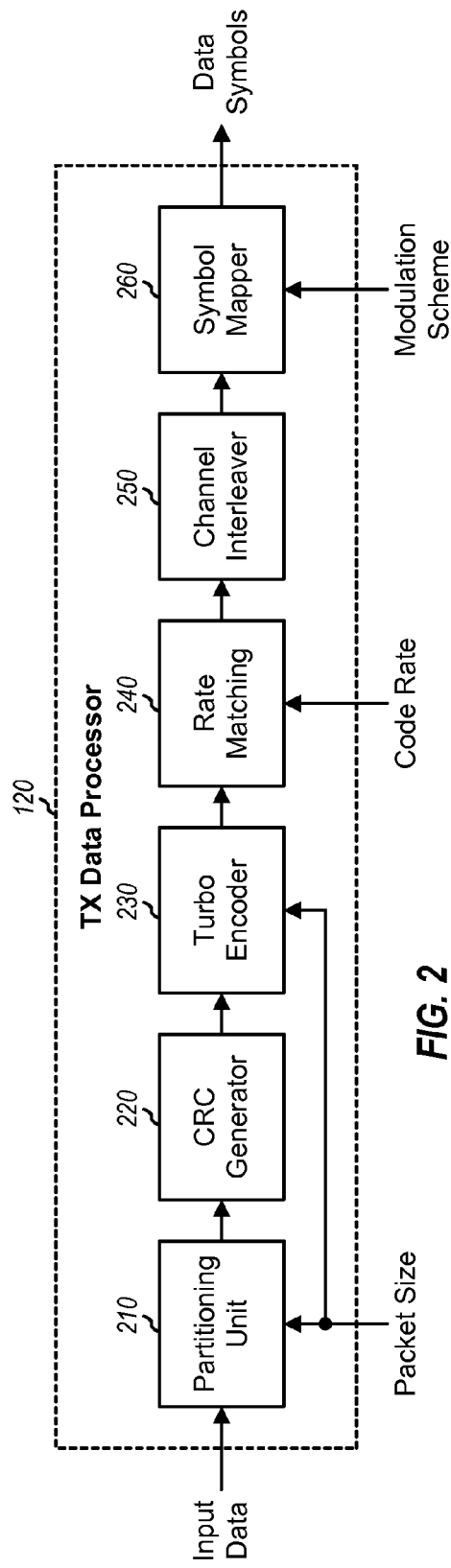
FIG. 2 shows a block diagram of a transmit (TX) data processor.

FIG. 2 shows a block diagram of a design of TX data processor 120, which may also be used for TX data processor 182 in FIG. 1. Within TX data processor 120, a partitioning unit 210 may receive data to transmit and partition the data into packets of a selected packet size. A packet may also be referred to as a transport block, a code block, a subpacket, etc. Each packet may be encoded and decoded separately. Each packet may have a fixed size or a variable size. For example, the packet size may be selected from a set of supported packet sizes based on various factors such as the amount of data to send, the amount of available resources, etc. The packet size may be within a range of 128 to 16,384 bits (for UMB) or some other range.

A cyclic redundancy check (CRC) generator 220 may generate a CRC value for each packet and append the CRC value to the packet. A Turbo encoder 230 may encode each packet based on a Turbo code and provide a coded packet. A rate matching unit 240 may select a subset of the code bits in each coded packet based on a selected code rate and may delete remaining bits in the coded packet. A channel interleaver 250 may interleave the undeleted code bits in each coded packet and provide an interleaved packet. The interleaving may provide time, frequency, and/or spatial diversity for the code bits. A symbol mapper 260 may map the interleaved bits to data symbols based on a selected modulation scheme. The packet size, code rate, and modulation scheme may be determined based on a packet format, which may be selected based on channel conditions, terminal capability, availability of system resources, etc.

Figure 3:
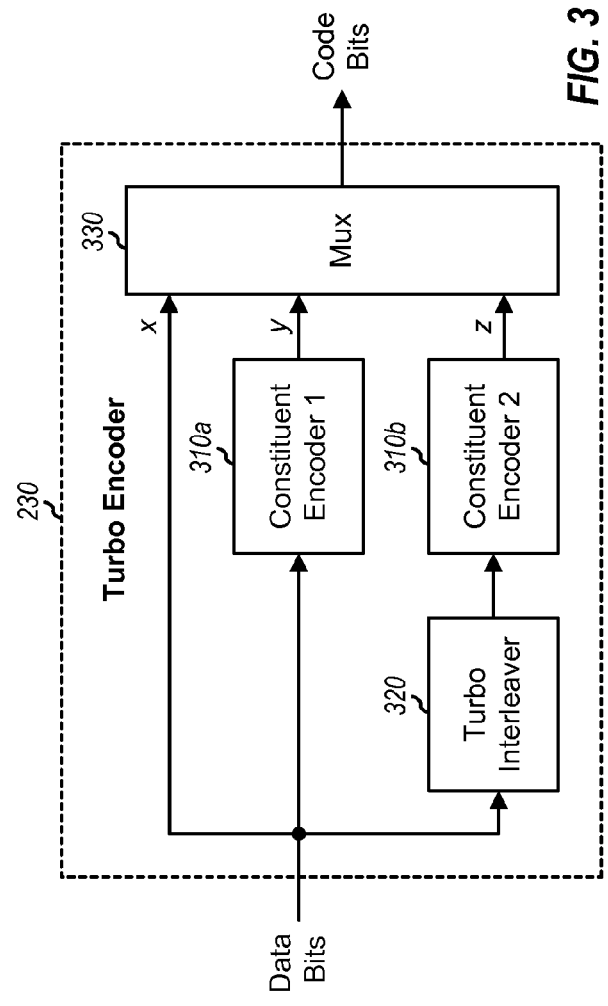
FIG. 3 shows a block diagram of a Turbo encoder.

FIG. 3 shows a block diagram of a design of Turbo encoder 230 in FIG. 2. Turbo encoder 230 implements a parallel concatenated convolutional code (PCCC) and includes two constituent encoders 310a and 310b, a Turbo interleaver 320, and a multiplexer (Mux) 330. Turbo encoder 230 encodes a packet of L data bits and provides a corresponding coded packet of S code bits, where L and S may be any suitable values.

Within Turbo encoder 230, Turbo interleaver 320 may interleave the data bits (denoted as x) in the packet based on a Turbo interleaver function. Constituent encoder 310a may encode the data bits based on a first constituent code and provide first parity bits (denoted as y). Similarly, constituent encoder 310b may encode the interleaved data bits from Turbo interleaver 320 based on a second constituent code and provide second parity bits (denoted as z). Constituent encoders 310a and 310b may implement two recursive systematic constituent codes, which may be convolutional codes. Multiplexer 330 may receive the data bits and the parity bits from constituent encoders 310a and 310b, multiplex the data bits and parity bits, and provide the code bits for the coded packet. The code bits may include the data bits, followed by the first parity bits, and then followed by the second parity bits.

In one design, each constituent encoder 310 may implement a rate ⅓ constraint length 4 constituent convolutional codes, and Turbo encoder 230 may implement a rate ⅕ Turbo code. Turbo encoder 230 may receive a packet of a variable size L and may generate 5L code bits for the coded packet. Turbo encoder 230 may also be implemented with constituent convolutional codes of other code rates and/or constraint lengths.

FIG. 4 shows a block diagram of a design of RX data processor 170, which may also be used for RX data processor 138 in FIG. 1. Within RX data processor 170, a log-likelihood ratio (LLR) computation unit 410 may receive the data symbol estimates from MIMO detector 160 and compute the LLRs of the code bits for each data symbol estimate. A data symbol may be obtained by mapping B code bits to a complex value in a signal constellation. B LLRs may be computed for the B code bits of the data symbol based on a corresponding data symbol estimate. The LLR for each code bit may indicate the likelihood of the code bit being zero ('0') or one ('1') given the data symbol estimate for that code bit. A channel de-interleaver 420 may de-interleave the LLRs in a manner complementary to the interleaving by channel interleaver 250 in FIG. 2. A de-rate matching unit 430 may perform de-rate matching on the de-interleaved LLRs in a manner complementary to the rate matching by unit 240 in FIG. 2 and may provide input LLRs. A Turbo decoder 440 may decode each packet of input LLRs and provide a decoded packet. A CRC checker 450 may check each decoded packet and provide the decoding status for the packet. An assembler 460 may assemble the decoded packets and provide decoded data.

FIG. 5 shows a block diagram of a design of Turbo decoder 440 in FIG. 4. Within Turbo decoder 440, a demultiplexer (Demux) 510 may receive input LLRs for a packet and demultiplex the input LLRs into LLRs X for data bits x, LLRs Y for first parity bits y, and LLRs Z for second parity bits z. A soft-input soft-output (SISO) decoder 520a may receive the data bit LLRs X and the first parity bit LLRs Y from demultiplexer 510 and de-interleaved data bit LLRs $X_2$ from a Turbo de-interleaver 540. SISO decoder 520a may derive new LLRs $X_1$ for the data bits based on the first constituent code. A Turbo interleaver 530 may interleave the data bit LLRs $X_1$ based on the Turbo interleaver function used for Turbo interleaver 320 in FIG. 3 and provide interleaved data bit LLRs $\tilde{X}_1$. A SISO decoder 520b may receive the data bit LLRs X and the second parity bit LLRs Z from demultiplexer 510 and the interleaved data bit LLRs $\tilde{X}_1$ from Turbo interleaver 530. SISO decoder 520b may derive new LLRs $\tilde{X}_2$ for the data bits based on the second constituent code. Turbo de-interleaver 540 may de-interleave the data bit LLRs $\tilde{X}_2$ based on an inverse of the Turbo interleaver function and provide the de-interleaved data bit LLRs $X_2$.

SISO decoders 520a and 520b may be maximum a posteriori (MAP) decoders that may implement a BCJR MAP algorithm or a lower complexity derivative. SISO decoders 520a and 520b may also implement a soft-output Viterbi (SOV) algorithm or some other decoding algorithm known in the art. The decoding by SISO decoders 520a and 520b may be iterated multiple times, e.g., 6, 8, 10, or more times. The decoding results may be more reliable after each iteration. After all decoding iterations are completed, a detector 560 may receive the final data bit LLRs from SISO decoder 520a, make a hard decision on each LLR, and provide decoded bits.

Channel interleaver 250 in FIG. 2 may be implemented with various designs such as a bit-reversal interleaver (BRI), a pruned bit-reversal interleaver (PBRI), etc. A BRI maps an n-bit linear address x to an n-bit interleaved address y according to a bit-reversal rule such that the n bits of y appear in the reverse order with respect to the n bits of x. The BRI mapping of the n-bit linear address x may be designated by the following BRI function:

$$y=\pi_n(x), \qquad \text{Eq (1)}$$

where $\pi_n(\ )$ is the BRI function. Addresses x and y have values within a range of 0 to M−1, where M=$2^n$ is the size of the BRI and is a power of two. Any linear address x may be easily mapped to a corresponding interleaved address y by reversing the n bits of x and using the reversed n bits as y.

A pruned BRI maps an n-bit linear address x less than L, where L<M, to an n-bit interleaved address y less than L according to the bit-reversal rule. However, the size of the pruned BRI is L whereas the size of the mother interleaver is M. L may be equal to the packet size and may be within a range of 128 to 13,684 for UMB. Addresses L to M−1 are pruned by the pruned BRI function and are not considered valid mappings. The pruned BRI mapping on the n-bit linear address x with parameter L may be designated by the following pruned BRI function:

$$y=\beta_{n,L}(x), \qquad \text{Eq (2)}$$

where $\beta_{n,L}(\ )$ is the pruned BRI function. Addresses x and y have values within a range of 0 to L−1, where L is the size of the pruned BRI and is not a power of two.

The mapping y=$\beta_{n,L}$(x) for a given x may be determined sequentially by starting from i=0 and maintaining the number of invalid mappings $\phi$(x) skipped along the way. $\phi$(x) may be initialized to 0. If i+$\phi$(x) maps to a valid interleaved address so that $\pi_n$(i+$\phi$(x))<L, then i may be incremented by 1. Otherwise, if i+$\phi$(x) maps to an invalid interleaved address, then $\phi$(x) may be incremented by 1. The operation may be repeated until i reaches x, and $\pi_n$(i+$\phi$(x)) is valid.

A sequential pruned BRI algorithm, which is also referred to as Algorithm 1, may be implemented with the pseudo-code below:

```
i = 0
φ(x) = 0
while (i ≤ x)
    if π_n(i + φ(x)) ≥ L
        then φ(x) = φ(x) + 1 ,
        else β_{n,L}(i) = π_n(i + φ(x))
            i = i + 1
    end
end
```

Algorithm 1 essentially generates a full list of M interleaved addresses by (i) traversing the M linear addresses starting from i=0 and (ii) determining an interleaved address for each linear address i. The full list is then pruned by deleting interleaved addresses equal to or greater than L to obtain a pruned list of L interleaved addresses. Linear address x is then mapped to the x-th interleaved address in the pruned list.

Table 1 gives an example BRI mapping and an example pruned BRI mapping for a case in which L=19 and M=32. In Table 1, the "dec" columns provide addresses in decimal representation, and the "binary" columns provide addresses in binary representation. As an example, linear address x=7 maps to interleaved address y=28 with the BRI mapping and to interleaved address y=10 with the pruned BRI mapping.

Invalid mappings are denoted by "x" in the last two columns.

TABLE 1

BRI mapping and pruned BRI mapping for L = 19 and M = 32

| Linear Address | | BRI Interleaved Address | | Pruned BRI Interleaved Address | |
|---|---|---|---|---|---|
| dec | binary | binary | dec | binary | dec |
| 0 | 00000 | 00000 | 0 | 00000 | 0 |
| 1 | 00001 | 10000 | 16 | 10000 | 16 |
| 2 | 00010 | 01000 | 8 | 01000 | 8 |
| 3 | 00011 | 11000 | 24 | 00100 | 4 |
| 4 | 00100 | 00100 | 4 | 01100 | 12 |
| 5 | 00101 | 10100 | 20 | 00010 | 2 |
| 6 | 00110 | 01100 | 12 | 10010 | 18 |
| 7 | 00111 | 11100 | 28 | 01010 | 10 |
| 8 | 01000 | 00010 | 2 | 00110 | 6 |
| 9 | 01001 | 10010 | 18 | 01110 | 14 |
| 10 | 01010 | 01010 | 10 | 00001 | 1 |
| 11 | 01011 | 11010 | 26 | 10001 | 17 |
| 12 | 01100 | 00110 | 6 | 01001 | 9 |
| 13 | 01101 | 10110 | 22 | 00101 | 5 |
| 14 | 01110 | 01110 | 14 | 01101 | 13 |
| 15 | 01111 | 11110 | 30 | 00011 | 3 |
| 16 | 10000 | 00001 | 1 | 01011 | 11 |
| 17 | 10001 | 10001 | 17 | 00111 | 7 |
| 18 | 10010 | 01001 | 9 | 01111 | 15 |
| 19 | 10011 | 11001 | 25 | x | x |
| 20 | 10100 | 00101 | 5 | x | x |
| 21 | 10101 | 10101 | 21 | x | x |
| 22 | 10110 | 01101 | 13 | x | x |
| 23 | 10111 | 11101 | 29 | x | x |
| 24 | 11000 | 00011 | 3 | x | x |
| 25 | 11001 | 10011 | 19 | x | x |
| 26 | 11010 | 01011 | 11 | x | x |
| 27 | 11011 | 11011 | 27 | x | x |
| 28 | 11100 | 00111 | 7 | x | x |
| 29 | 11101 | 10111 | 23 | x | x |
| 30 | 11110 | 01111 | 15 | x | x |
| 31 | 11111 | 11111 | 31 | x | x |

It can be shown that Algorithm 1 performs M−1 iterations to map L linear addresses within a range of 0 to L−1 to L interleaved addresses within the range of 0 to L−1. Algorithm 1 traverses all M linear addresses within a range or 0 to $2^n-1$, independent of the value of L, when mapping the linear addresses within the range of 0 to L−1 and prunes M−L−1 invalid mappings along the way. Hence, the complexity of a pruned BRI is determined by the size of the mother interleaver M and not by the size of the pruned BRI.

A major disadvantage of the sequential pruned BRI algorithm is that the interleaved addresses are generated sequentially. In particular, to determine interleaved address y corresponding to linear address x, interleaved addresses of all linear addresses less than x are first determined. This follows from the fact that the number of pruned mappings before x must be known in order to know where to map x. This sequential address generation may introduce a delay bottleneck, especially when interleaving/de-interleaving and Turbo encoding/decoding long packets, e.g., of 16-kilobit (16K) size used in UMB.

In an aspect, an efficient pruned BRI algorithm that can determine an interleaved address y for a linear address x in at most $\log_2(x-1)$ steps is described herein. The efficient pruned BRI algorithm has a simple architecture that may be implemented using basic logic gates and may further have a short critical path delay.

The following description assumes that the size L of the pruned BRI may be given as:

$$\frac{M}{2} < L < M. \qquad \text{Eq (3)}$$

If the condition in equation (3) is not satisfied, then the pruned BRI may be reformulated such that M is the smallest power of 2 greater than or equal to L. Furthermore, if L=M, then $\phi(x)=0$ for all values of x, and $\beta_{n,L}(x)=\pi_n(x)$. In this case, there are no pruned addresses since all linear addresses have valid mappings. Therefore, the description below assumes L as defined in equation (3).

From the definition of the bit-reversal operation and the condition shown in equation (3), it follows that if $\pi_n(x) \geq L$ then $\pi_n(x+1) < L$. Thus, two consecutive linear addresses cannot both have invalid mappings. This fact may be used to obtain a recursive definition of $\phi(x)$, for $0 \leq x < L$, as follows:

$$\phi(x) = \begin{cases} 0 & \text{if } x = 0 \\ \phi(x-1) & \text{if } \pi_n(x+\phi(x-1)) < L \\ \phi(x-1)+1 & \text{otherwise.} \end{cases} \qquad \text{Eq (4)}$$

In addition, if $i > x$, then $\phi(i) \geq \phi(x)$. Hence $\phi(\ )$ is a non-decreasing function.

The complexity of Algorithm 1 is on the order of M, or O(M). This follows from the fact that the number of invalid mappings $\phi(x)$ that have occurred in mapping all linear addresses less than x is first determined in order to ascertain which interleaved address to map x. An algorithm to determine $\phi(x)$ with complexity O(n), where $n = \log_2(M)$, may be derived by analyzing the bit structure of the invalid mappings.

The quantity $\phi(x)$ represents the minimum number of invalid mappings to skip such that all linear addresses from 0 to x have valid mappings. Equivalently, $\phi(x)$ represents the minimum number to add to x such that exactly x+1 linear addresses in the range of 0 to $x+\phi(x)$ have valid mappings.

Figure 6:
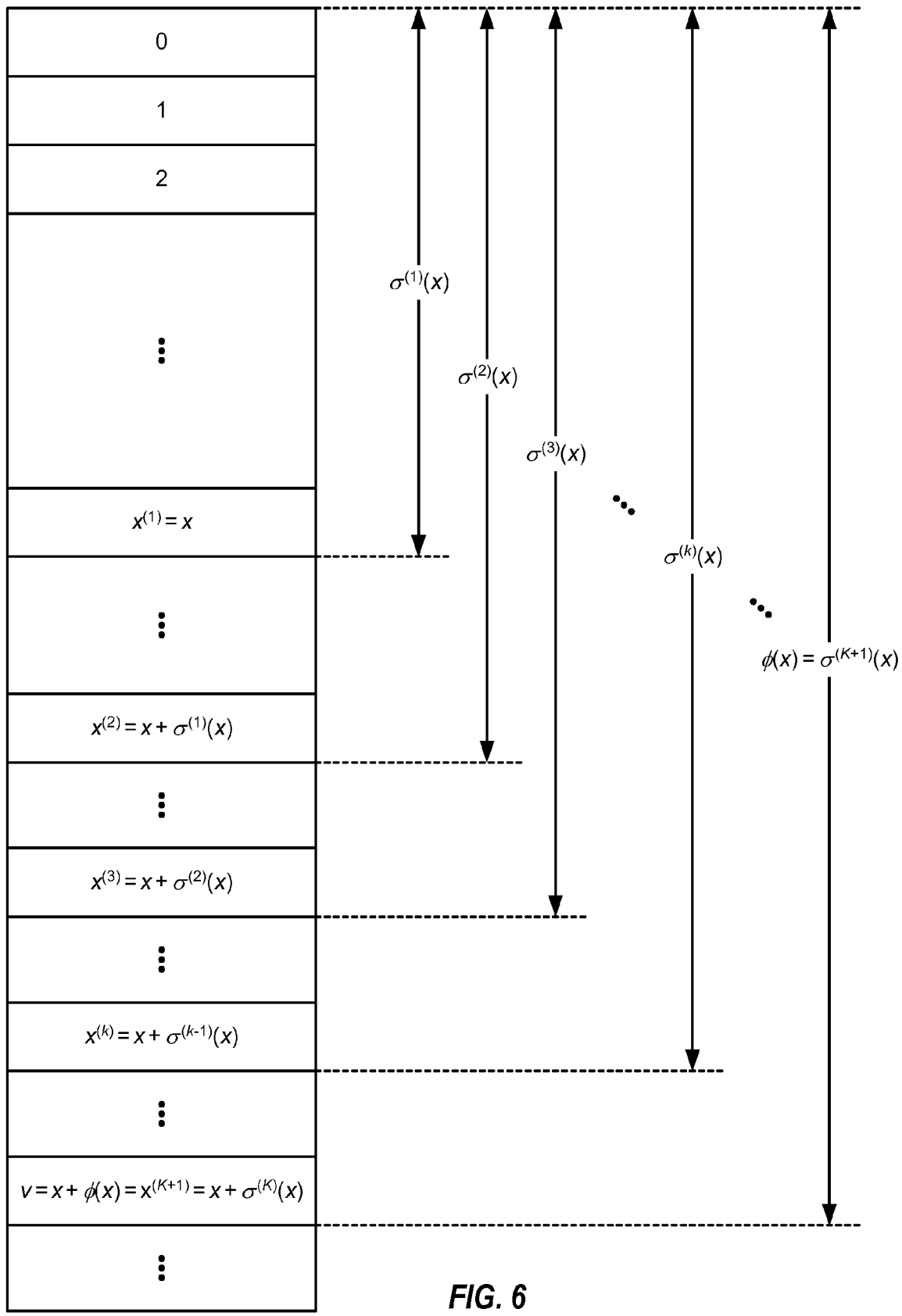
FIG. 6 illustrates iterative determination of the total number of invalid mappings.

FIG. 6 shows iterative determination of $\phi(x)$ for a given linear address x. The number of linear addresses in the range of 0 to $x^{(1)}=x$ with invalid mappings may be denoted as $\sigma^{(1)}(x)=\sigma(x)$. $\phi(x)$ is not necessarily equal to $\sigma^{(1)}(x)$ and may be given as $\phi(x) \geq \sigma^{(1)}(x)$. This follows from the fact that for $\sigma^{(1)}(x)$ linear addresses in the range of 0 to x with invalid mappings, at least $\sigma^{(1)}(x)$ more linear addresses greater than x should be checked to see if they have valid mappings.

Thus, $\phi(x)$ is at least equal to the number of invalid mappings in the range of 0 to $x^{(2)}=x+\sigma^{(1)}(x)$. The number of linear addresses in the range of 0 to $x^{(2)}$ with invalid mappings may be denoted as $\sigma^{(2)}(x)=\sigma(x+\sigma^{(1)}(x))$. The linear addresses from $x^{(1)}+1$ to $x^{(2)}$ may have invalid mappings, which should be taken into account. Thus, $\phi(x)$ is at least equal to the number of invalid mappings in the range of 0 to $x^{(3)}=x+\sigma^{(2)}(x)$. The linear addresses from $x^{(2)}+1$ to $x^{(3)}$ may have invalid mappings, which should be taken into account.

In general, the number of linear addresses in the range of 0 to $x^{(k)}$ with invalid mappings may be denoted as $\sigma^{(k)}(x)=\sigma(x+\sigma^{(k-1)}(x))$, where k is an index for iteration. The process may be repeated for K+1 iterations until the range of 0 to $x^{(K+1)}=x+\sigma^{(K)}(x)$ contains exactly x+1 valid mappings, which may be given as:

$$\underbrace{x + \sigma^{(K)}(x) + 1}_{\text{number of addresses in interval}} - \underbrace{\sigma(x + \sigma^{(K)}(x))}_{\text{number of invalid mappings in interval}} = \underbrace{x + 1}_{\text{number of valid mappings in interval}}, \quad \text{Eq (5)}$$

or equivalently until $$\sigma^{(K)}(x) = \sigma(x + \sigma^{(K)}(x)) \equiv \sigma^{(K+1)}(x). \quad \text{Eq (6)}$$

When the condition in equation (5) or (6) is satisfied, $\phi(x) = \sigma^{(K+1)}(x)$. K+1 is the minimum number of iterations such that equation (5) or (6) is satisfied and may be dependent on the value of x.

An algorithm that computes $\phi(x)$ iteratively using $\sigma^{(k)}(x)$, which is also referred to as Algorithm 2, may be implemented with the pseudo-code below:

```
k = 0
σ⁽⁰⁾(x) = 0
do {
    σ⁽ᵏ⁺¹⁾(x) = σ(x + σ⁽ᵏ⁾(x))
    k = k + 1
}
while σ⁽ᵏ⁺¹⁾(x) ≠ σ⁽ᵏ⁾(x)
φ(x) = σ⁽ᵏ⁺¹⁾(x)
```

It can be shown that Algorithm 2 can converge to $\phi(x)$ in at most n−1 iterations, so that K≤n−1.

The problem of determining $\phi(x)$ reduces to that of determining $\sigma^{(k)}(x)$ for each iteration k, where $\sigma^{(k)}(x)$ is the number of invalid mappings in the range of 0 to $x^{(k)} = x + \sigma^{(k-1)}(x)$. For simplicity, the following description omits iteration index k from both $\sigma^{(k)}(x)$ and $x^{(k)}$, which may be denoted as simply $\sigma^{(x)}$ and x, respectively. $\sigma^{(x)}$ may be determined by studying the bit representation of the invalid addresses between L and M−1. The binary representation of $x < 2^n$ may be denoted as follows:

$$x = x_{n-1}x_{n-2} \ldots x_1 x_0, \text{ with } x_i = 0 \text{ or } 1, \text{ for } 0 \le i < n, \quad \text{Eq (7)}$$

where $x_{n-1}$ is the most significant bit (MSB) and $x_0$ is the least significant bit (LSB). A notation x[i:j] may represent a set of consecutive bits $x_i, x_{i-1}, \ldots, x_j$, ordered from MSB to LSB. A concatenation of two bit strings $x[i_1:j_1]$ and $x[i_2:j_2]$ may be represented as $x[i_1:j_1]||x[i_2:j_2]$.

The addresses between L and M−1 may be grouped by their MSBs according to the bit representation of L−1, as follows. The number of zero bits in the bit representation of L−1 may be denoted as z. A set of indices of the zero bits in the bit representation of L−1, ordered from MSB to LSB, may be denoted as I'. For example, if L−1=1010100 (binary), then z=4, and I'={5, 3, 1, 0}. Addresses from L to M−1, or 1010101≤x≤1111111, may be grouped into z=4 classes as follows:

$C_1'$: 11xxxxx: 16 integers,
$C_2'$: 1011xxx: 8 integers,
$C_3'$: 101011x: 2 integers, and
$C_4'$: 1010101: 1 integer.

The MSBs that define the four classes may be determined by scanning the bit representation of L−1 from left to right and searching for the zero bits. The MSBs of the first class $C_1'$ correspond to the MSBs of L−1 up to the first zero, and then flipping the first zero to one. The MSBs of the second class $C_2'$ correspond to the MSBs of L−1 up to the second zero, and then flipping the second zero to one. The MSBs of each remaining class are obtained in similar manner. The smallest number in each of the z classes may be expressed as:

$$\delta_i' = \left(\left\lfloor \frac{L-1}{2^{I'(i)}} \right\rfloor + 1\right) \cdot 2^{I'(i)}, \text{ for } i = 1, 2, \ldots, z, \quad \text{Eq (8)}$$

where "$\lfloor \ \rfloor$" is a floor operator that provides the next lower integer value.

Each class may be designated by its smallest number $\delta_1'$. For the example above with L−1=1010100, the smallest number for each of the four classes may be given as $\delta_1'$=1100000, $\delta_2'$=1011000, $\delta_3'$=1101010 and $\delta_4'$=1010101.

A set of integers that become invalid when bit-reversed is of interest in determining $\sigma(x)$. These integers belong to the classes defined above, albeit in bit-reversed order. The classes of invalid integers in bit-reverse order may be denoted as $\delta_i = \pi_n(\delta_i')$, for i=1, 2, . . . , z, and the corresponding classes may be denoted as $C_i$. The set of indices of zero bits of $\pi_n(L-1)$, ordered from LSB to MSB, may be denoted as I. Hence, if $x \in C_i$, then $\pi_n(x) \ge L$ and $x[I(i):0] \ge \delta_i[I(i):0]$, where I(i) is the i-th element in set I. For the example given above with L−1=1010100, $\pi_n(L-1)$=0010101, z=4, and I={1, 3, 5, 6}. The four classes of invalid integers in bit-reversed order may be given as follows:

$C_1$: xxxxx11: $\delta_1$=0000011,
$C_2$: xxx1101: $\delta_2$=0001101,
$C_3$: x11010: $\delta_3$=0110101, and
$C_4$: 1010101: $\delta_4$=101010.

The number of invalid mappings $\sigma(x)$ in the range of 0 to x may be determined by counting the number of invalid mappings in each class $C_i$, for i=1, 2, . . . , z. The number of invalid mappings in class $C_i$ may be denoted as $\sigma_i(x)$ and may be determined using:

$\delta_i$,

The MSBs of x up to the left of the i-th zero bit, or x[n−1:I(i)+1], and

The remaining LSBs of x including the i-th zero bit, or x[I(i):0].

The n−I(i)−1 MSBs of x, which are given by x[n−1:I(i)+1], represent the number of integers belonging to $C_i$ that have appeared before x. These integers have the same I(i)+1 LSBs as $\delta_i$ but are less than $x[n-1:I(i)+1]||\delta_i[I(i):0]$. The I(i)+1 LSBs of x, which are given by x[I(i):0], may be used to check if $x \ge x[n-1:I(i)+1]||\delta_i[I(i):0]$, or equivalently, if $x[I(i):0] \ge \delta_i[I(i):0]$. This checks whether x itself maps to an invalid integer in $C_i$ or whether x maps to an integer greater than the last invalid integer in $C_i$. In either case, $\sigma_i(x)$ may be incremented by 1. Mathematically, $\sigma_i(x)$ may be expressed as:

$$\sigma_i(x) = \begin{cases} x[n-1:I(i)+1] & \text{if } x[I(i):0] < \delta_i[I(i):0] \\ x[n-1:I(i)+1]+1 & \text{otherwise.} \end{cases} \quad \text{Eq (9)}$$

$\sigma(x)$ is equal to the sum of all $\sigma_i(x)$ for the z classes and may be expressed as:

$$\sigma(x) = \sum_{i=1}^{z} \sigma_i(x). \quad \text{Eq (10)}$$

An algorithm that computes $\sigma(x)$ using equations (9) and (10), which is also referred to as Algorithm 3, may be implemented with the pseudo-code below:

```
z = number of zero bits in bit representation of L−1
I = set of indices of zero bits in bit representation of L−1,
    from LSB to MSB
for i = 1 to z
    σ_i(x) = x[n − 1:I(i) + 1]
    if x[I(i):0] ≥ δ_I[I(i):0]
        then σ_i(x) = σ_i(x) + 1
    end
end
```

$$\sigma(x) = \sum_{i=1}^{z} \sigma_i(x)$$

Figure 7:
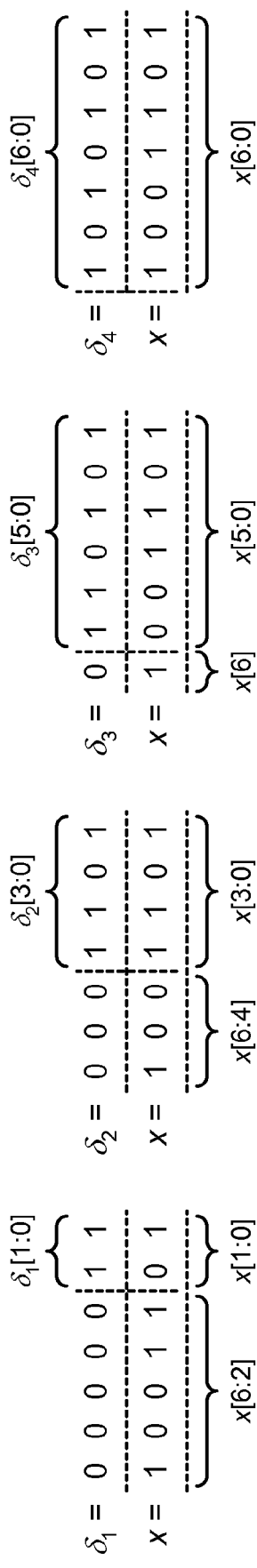
FIG. 7 shows computation of the number of invalid mappings for one iteration.

FIG. 7 shows computation of $\sigma(x)$ for an example with $L-1=1010100$, $x=1001101$, $\pi_n(L-1)=0010101$, $z=4$, and $I=\{1, 3, 5, 6\}$. The four classes $C_1$ through $C_4$ of invalid integers in bit-reversed order are given above.

For $i=1$, $\delta_1=0000011$ and $I(1)=1$. Hence, $x[6:2]=10011$, $x[1:0]=01$ and $\delta_1[1:0]=11$. Since $x[1:0]<\delta_1[1:0]$, $\sigma_1(x)=x[6:2]=10011=19_{(10)}$, where "$_{(10)}$" denotes decimal representation.

For $i=2$, $\delta_2=0001101$ and $I(2)=3$. Hence, $x[6:4]=100$, $x[3:0]=1101$ and $\delta_2[3:0]=1101$. Since $x[3:0]\geq\delta_2[3:0]$, $\sigma_2(x)=x[6:4]+1=101=5_{(10)}$.

For $i=3$, $\delta_3=0110101$ and $I(3)=5$. Hence, $x[6]=1$, $x[5:0]=001101$ and $\delta_3[5:0]=110101$. Since $x[5:0]<\delta_3[5:0]$, $\sigma_3(x)=x[6]=1=1_{(10)}$.

For $i=4$, $\delta_4=1010101$ and $I(4)=6$. Hence, $x[6:0]=1001101$ and $\delta_4[6:0]=1010101$. Since $x[6:0]<\delta_4[6:0]$, $\sigma_4(x)=0=0_{(10)}$. $\sigma(x)$ may then be computed as $19+5+1+0=25_{(10)}$.

As noted above, $\phi(x)$ may be determined iteratively. For the first iteration $k=1$, $\sigma^{(1)}(x)$ may be determined for linear address x as described above. For the next iteration $k=2$, $\sigma^{(1)}(x)$ may be summed with x to obtain $x^{(2)}$. $\sigma^{(2)}(x)$ may then be determined for $x^{(2)}$ as described above. $K+1$ iterations may be performed until $\sigma^{(K+1)}(x)=\sigma^{(K)}(x)$. $\phi(x)$ may then be set equal to $\sigma^{(K+1)}(x)$.

An interleaved address y for a linear address x based on the pruned BRI mapping $y=\beta_{n,L}(x)$ with parameter L may be determined as follows. First, an intermediate address v may be computed as:

$$v = x + \phi(x), \quad \text{Eq(11)}$$

where $\phi(x)$ may be determined iteratively based on $\sigma^{(k)}(x)$ as described above.

Interleaved address y may then be determined by applying the BRI mapping on intermediate address v, as follows:

$$y = \pi_n(v) = \beta_{n,L}(x). \quad \text{Eq (12)}$$

Figure 8:
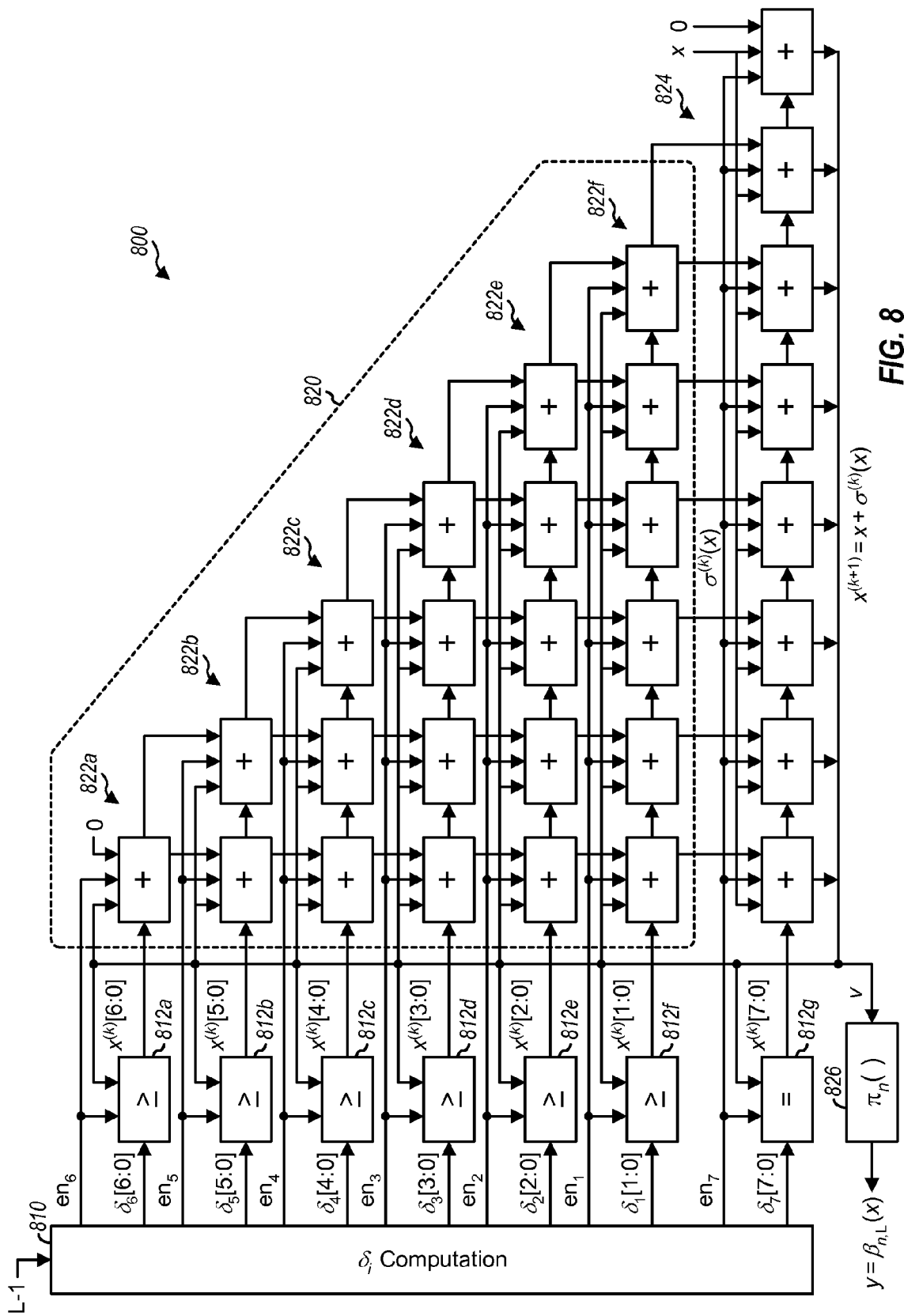
FIG. 8 shows a block diagram of an address generator for a pruned BRI.

FIG. 8 shows a block diagram of a design of an address generator 800 for a pruned BRI for a case in which $n=8$. The bit representation of $L-1$ includes a maximum of $n-1$ zero bits. A logic circuit 810 receives $L-1$ and generates $n-1$ outputs $\delta_i[i:0]$, for $i=1, \ldots, n-1$. Logic circuit 810 also generates an enable signal $en_i$ for each $\delta_i[i:0]$ output to indicate whether or not that $\delta_i[i:0]$ output is valid.

A set of $n-1$ comparators 812a through 812g receive the $n-1$ $\delta_i[i:0]$ outputs from logic circuit 810 and also $n-1$ $x^{(k)}[i:0]$ inputs obtained from linear address $x^{(k)}$ for the k-th iteration. Each comparator 812 compares its $x^{(k)}[i:0]$ against its $\delta_i[i:0]$, provides a zero (e.g., logic low) if $x^{(k)}[i:0]$ is less than $\delta_i[i:0]$, and provides a one (e.g., logic high) otherwise.

A bank of 1-bit full adders 820 computes $\sigma^{(k)}(x)$ for each iteration k based on the linear address $x^{(k)}$ and the outputs of comparators 812. Bank 820 includes $n-2$ rows of adders 822a through 822f for $n-2$ $\delta_i[i:0]$ outputs. Each row of adders 822 receives $x[n-1:i+1]$ and an output from a preceding row of adders (if present). Each row of adders 822 generates $\sigma_i(x)=x[n-1:i+1]$ if the associated comparator 812 provides logic low or $\sigma_i(x)=x[n-1:i+1]+1$ if the associated comparator 812 provides logic high. Each row of adders 822 passes the output from the preceding row if the $en_i$ signal is logic low and sums the output from the preceding row with $\sigma_i(x)$ if the $en_i$ signal is logic high.

The $n-2$ rows of adders 822a through 822f collectively implement Algorithm 3 by accumulating right-shifted copies of $x^{(k)}$ (which are the $\sigma_i(x)$) depending on the control signals from the $n-2$ comparators 812a through 812f, where $x^{(k)}=x+\sigma^{(k-1)}(x)$ is the input to the rows of adders for the k-th iteration. Each row of adders 822 accumulates $\sigma_i(x)$ with the output from the preceding row of adders if the $en_i$ signal is logic high. The last row of adders 822f provides $\sigma^{(k)}(x)$, which is equal to $\phi(x)$ after all iterations are completed.

Each 1-bit full adder receives a first input bit from linear address $x^{(2)}$, a second input bit from another adder above, a carry-in bit from another adder to the left, and the $en_i$ signal from logic unit 810. Each adder sums the three input bits and provides a sum bit to an adder below and a carry-out bit to an adder to the right or below. If the $en_i$ signal is de-asserted, then the first input bit is zeroed out.

Each comparator 812 generates a one if $x[i:0]\geq\delta_i[i:0]$ or a zero otherwise. Each comparator 812 provides its output as a carry-in bit to the first adder in the same row. This effectively adds one to $\sigma_i(x)$ if $x[i:0]\geq\delta_i[i:0]$. The adders in the last row 824 generate an output that corresponds to adding a one to $\sigma_{n-1}(x)$ if $\delta_{n-1}(x)\geq L-1$. Since the maximum value of $\delta_{n-1}(x)$ is $L-1$, an equality comparator 812g is sufficient.

The output from the last row of adders 822f correspond to $\sigma^{(k)}(x)$ for the k-th iteration. For the first iteration, x is provided to adder bank 820. For each subsequent iteration, row of adders 824 sums x with $\sigma^{(k)}(x)$ from the last row of adders 822f to obtain $x^{(k+1)}=x+\sigma^{(k)}(x)$, which is provided as a new linear address for the next iteration $k+1$.

The output of adder bank 820 may be sampled every $n-1$ clock cycles to read $\phi(x)$. A comparator may be added (not shown in FIG. 8) to compare $\sigma^{(k)}(x)$ and $\sigma^{(k+1)}(x)$ for early termination. Row of adders 824 sums $\phi(x)$ from the last row of adders 822f with linear address x and provides intermediate address v, as shown in equation (11). A BRI unit 826 receives v and provides the bit reverse of v as interleaved address y for the pruned BRI, as shown in equation (12).

For the design shown in FIG. 8, the critical path delay is $2n-2$ stages, which may be meets by current integrated circuit (IC) process technologies for most values of n of interest. Comparators 812 may be implemented with XOR trees and may introduce negligible delay.

Figure 9:
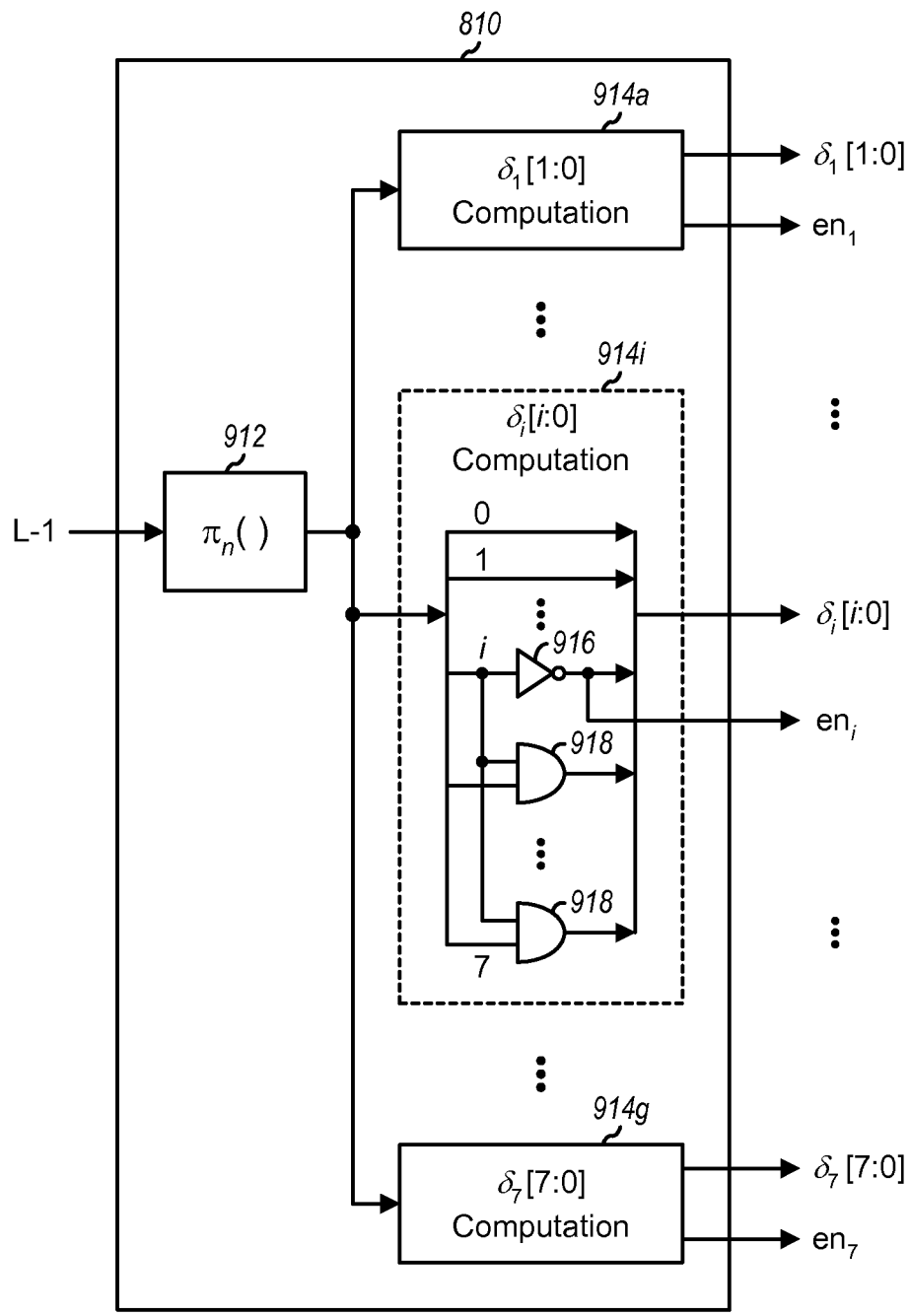
FIG. 9 shows a block diagram of a logic circuit within the address generator.

FIG. 9 shows a block diagram of a design of logic circuit 810 in FIG. 8. Within logic circuit 810, a bit-reversal unit 910 receives $L-1$ and provides bit-reversed $L-1$. $n-1$ units 912a through 912g receive the bit-reversed $L-1$ and generate $n-1$ outputs $\delta_1[1:0]$ through $\delta_7[7:0]$, respectively. Within unit 912i for the $\delta_i[i:0]$ output, an inverter 916 receives the i-th bit of the bit-reversed $L-1$ and provides the $en_i$ signal for the $\delta_i[i:0]$ output. The $en_i$ signal is logic high if the i-th bit is zero and is logic low otherwise. Unit 912i provides the output of inverter 916 as well as bits 0 through $i-1$ as the $\delta_i[i:0]$ output to associated comparator 812 in FIG. 8. AND gates 918 zero out bits $i+1$ through $n-1$.

Figure 10:
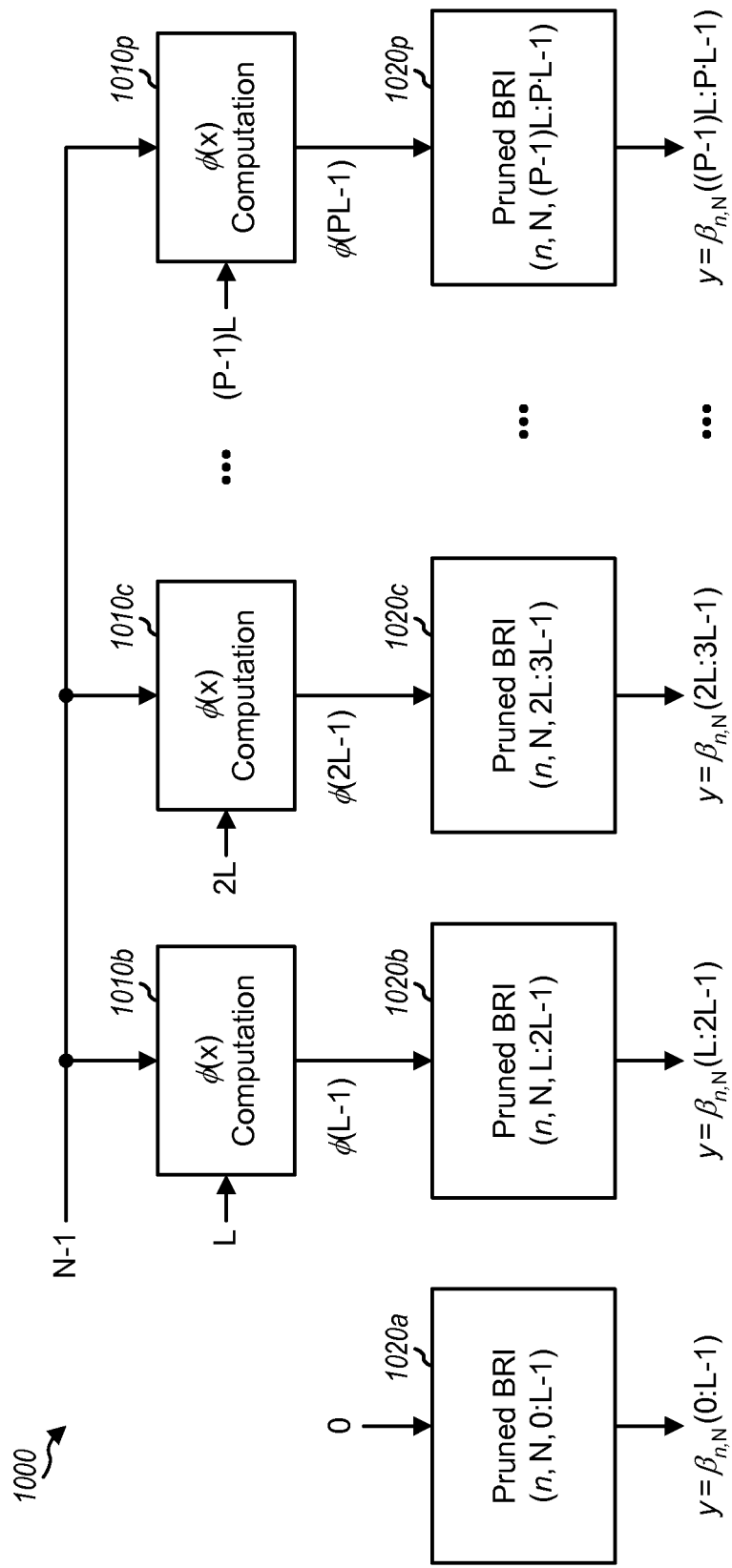
FIG. 10 shows a block diagram of a look-ahead pruned BRI.

FIG. 10 shows a block diagram of a design of an address generator 1000 for a look-ahead pruned BRI based on Algorithm 2. A packet of length N may be partitioned into P sub-packets of length L, where L, P and N may each be any suitable integer. Each sub-packet may be interleaved independently. P-1 blocks 1010b through 1010p compute the number of invalid mappings for sub-packets 1 through P−1, respectively. Block 1010 for sub-packet j computes the number of invalid mappings in the range from 0 to j·L−1, which is denoted as φ(j·L−1), where j=1, . . . , P−1. P−1 component pruned BRIs 1020b through 1020p may receive φ(j·L−1) from blocks 1010b through 1101p, respectively. Component pruned BRI 1020a may receive 0 for φ(0). For each component pruned BRI 1020, φ(j·L−1) may be used to initialize the pruned BRI to interleave sub-packet j.

In one design, the sequential pruned BRI algorithm (e.g., Algorithm 1) may be used for each component pruned BRI 1020. In another design, each component pruned BRI 1020 may interleave L integers in parallel using 2L adders, 2L comparators, a multiplexer, and control logic. The parallel design may be suitable for small values of L, e.g., for L up to 16.

The design shown in FIG. 10 exploits the fact that for a sub-packet of length L, there can be at most L invalid mappings in a range spanning 2L integers. Hence, the j-th component pruned BRI maps L integers j·L through (j+1)·L−1 into the first L valid interleaved addresses in the range j·L+φ(j·L−1) through j·L+φ(j·L−1)+2L−1. The component pruned BRI computes 2L sums j·L+φ(j·L−1) through j·L+φ(j·L−1)+2L−1, compares their bit-reversed values with N−1 to determine if they are valid addresses, and passes the valid addresses to a multiplexer. The look-ahead pruned BRI in FIG. 10 may have higher operating speed by a factor of P using serial component pruned BRIs or by a factor of L using parallel component pruned BRIs over a fully sequential pruned BRI. However, the complexity of the look-ahead pruned BRI rapidly increases for larger values of L.

A Turbo interleaver may be used in a Turbo encoder (e.g., as shown in FIG. 3) to produce a random-like weight spectrum of codewords when used with systematic feedback constituent convolutional encoders. The Turbo interleaver breaks patterns in input sequences by pairing low-weight parity sequences from first constituent encoder 310a with high-weight parity sequences from second constituent encoder 310b. The Turbo interleaver may be based on a block interleaver that writes a sequence of linear addresses into a 2D array in one direction (e.g., row-by-row), then applies independent pseudo-random permutations to the row and column entries, and then reads the shuffled addresses in the other direction (e.g., column-by-column). The permutations applied to the entries in each row of the array may be based on linear congruential sequences. The permutations applied to the entries in each column of the array may be based on a bit-reversal function, similar to the one employed in a channel interleaver. Pruning may be used for the Turbo interleaver to accommodate a variable packet size.

In one design, a Turbo interleaver may be implemented as follows. First, a small positive integer r may be chosen based on the memory bank architecture of the Turbo interleaver. For example, r may be equal to 5 (as in UMB) so that the Turbo interleaver memory is composed of $2^r=32$ banks for 32 rows. Next, a smallest positive integer n is determined such that $L \leq 2^{r+n}$. This is equivalent to finding a smallest sized $2^r \times 2^n$ array that can hold L entries. The number of rows in the array is given by $2^r$, and the number of columns in the array is given by $2^n$.

The array with $2^r$ rows and $2^n$ columns may be filled with a sequence of linear addresses 0 through M−1, row by row from top to bottom, where $M=2^r \cdot 2^n$. The M entries of the array may then be shuffled as described below. The M shuffled entries may then be read column by column from left to right to obtain a sequence of interleaved addresses corresponding to the sequence of linear addresses.

The entries of the array may be shuffled by permuting the order of the $2^r$ rows and applying an independent permutation to the $2^n$ entries in each row. The $2^r$ rows may be shuffled in bit-reversed order. The result of the row shuffling is a set of interleaved rows. The $2^n$ entries of each row may be shuffled independently using a linear congruential sequence (LCS) recursion whose parameters may be determined using a look-up table (LUT) based on the row index and n. The result of the LCS operation is a set of interleaved column values for each row. The order of the LCS operation and the row permutation may also be swapped. Finally, the interleaved addresses may be obtained by combining the interleaved column and row values in the opposite order with respect to the order of the linear addresses. The last step may be achieved by reading the interleaved entries in the array in the opposite order (e.g., column by column) to which the array was filled (e.g., row by row). Each interleaved entry contains an interleaved address. An interleaved address may be pruned if it is equal to or greater than L.

The generation of interleaved addresses for an example Turbo interleaver is described below. In this example, r=n=3 and $M=2^6=64$. 6-bit linear addresses 0 to 63 may be written row by row into a $2^3 \times 2^3$ array, as shown in Table 2. For an example in which L=44, valid linear addresses 0 through 43 are shown with bolded text in Table 2, and invalid linear addresses 44 through 63 are shown with regular text.

TABLE 2

Linear addresses written row by row

|     | 000 | 001 | 010 | 011 | 100 | 101 | 110 | 111 |
|-----|-----|-----|-----|-----|-----|-----|-----|-----|
| 000 | 0  | 1  | 2  | 3  | 4  | 5  | 6  | 7  |
| 001 | 8  | 9  | 10 | 11 | 12 | 13 | 14 | 15 |
| 010 | 16 | 17 | 18 | 19 | 20 | 21 | 22 | 23 |
| 011 | 24 | 25 | 26 | 27 | 28 | 29 | 30 | 31 |
| 100 | 32 | 33 | 34 | 35 | 36 | 37 | 38 | 39 |
| 101 | 40 | 41 | 42 | 43 | 44  | 45  | 46  | 47  |
| 110 | 48  | 49  | 50  | 51  | 52  | 53  | 54  | 55  |
| 111 | 56  | 57  | 58  | 59  | 60  | 61  | 62  | 63  |

The 8 rows of the array may be shuffled in bit-reversed order. Table 3 shows the entries in the array after row permutation.

TABLE 3

Entries in array after row permutation

|     | 000 | 001 | 010 | 011 | 100 | 101 | 110 | 111 |
|-----|-----|-----|-----|-----|-----|-----|-----|-----|
| 000 | 0  | 1  | 2  | 3  | 4  | 5  | 6  | 7  |
| 001 | 32 | 33 | 34 | 35 | 36 | 37 | 38 | 39 |
| 010 | 16 | 17 | 18 | 19 | 20 | 21 | 22 | 23 |
| 011 | 48  | 49  | 50  | 51  | 52  | 53  | 54  | 55  |
| 100 | 8  | 9  | 10 | 11 | 12 | 13 | 14 | 15 |
| 101 | 40 | 41 | 42 | 43 | 44  | 45  | 46  | 47  |
| 110 | 24 | 25 | 26 | 27 | 28 | 29 | 30 | 31 |
| 111 | 56  | 57  | 58  | 59  | 60  | 61  | 62  | 63  |

The entries in each row may be shuffled based on an LCS recursion. For example, the moduli of the 8 LCS recursions for the 8 rows may be 5, 7, 5, 7, 1, 1, 1 and 7. The LCS recursion for each row may be performed as described below. Table 4 shows the shuffled entries in each row after the LCS recursion.

TABLE 4

Shuffled entries in each row after LCS recursion

|     | 000 | 001 | 010 | 011 | 100 | 101 | 110 | 111 |
|-----|-----|-----|-----|-----|-----|-----|-----|-----|
| 000 | 5   | 2   | 7   | 4   | 1   | 6   | 3   | 0   |
| 001 | 39  | 38  | 37  | 36  | 35  | 34  | 33  | 32  |
| 010 | 21  | 18  | 23  | 20  | 17  | 22  | 19  | 16  |
| 011 | 55  | 54  | 53  | 52  | 51  | 50  | 49  | 48  |
| 100 | 9   | 10  | 11  | 12  | 13  | 14  | 15  | 8   |
| 101 | 41  | 42  | 43  | 44  | 45  | 46  | 47  | 40  |
| 110 | 25  | 26  | 27  | 28  | 29  | 30  | 31  | 24  |
| 111 | 63  | 62  | 61  | 60  | 59  | 58  | 57  | 56  |

The interleaved addresses may then be read column by column. Without pruning, the sequence of interleaved addresses may be given as 5, 39, 21, 55, 9, 41, 25, 63, 2, etc. With pruning of addresses equal to or larger than L=44, the sequence of interleaved addresses may be given as 5, 39, 21, 9, 41, 25, 2, etc.

A mapping of an (r+n)-bit linear address x to an (r+n)-bit interleaved address y may be designated by the following Turbo interleaver function:

$$y = \rho_{r,n}(x), \quad \text{Eq (13)}$$

where $\rho_{r,n}(\cdot)$ is the Turbo interleaver function.

The Turbo interleaver function, without pruning, may be expressed as:

$$\rho_{r,n}(x) = \qquad \text{Eq (14)}$$
$$2^n \cdot \pi_r(x \bmod 2^r) + \left[\left[\left(\left\lfloor \frac{x}{2^r} \right\rfloor + 1\right) \bmod 2^n\right] \times LUT(x \bmod 2^r, n)\right] \bmod 2^n,$$

where $\pi_r(\cdot)$ is an r-bit BRI function, and LUT is a look-up table that stores the moduli of the $2^r$ LCS recursions for every n.

Equation (14) provides an interleaved address in two parts. The first part is determined by a bit-reversal function $2^n \cdot \pi_r(x \bmod 2^r)$ that provides a row value that is applicable for all $2^n$ entries in a given row. The second part is determined by an LCS function that provides a column value that is within a range of 0 to $2^n-1$. The interleaved address is obtained by summing the row value and the column value.

For the example Turbo interleaver described above with parameters r=n=3 and no pruning, linear address $x=010001=17_{(10)}$ may be mapped to interleaved address y based on the Turbo interleaver function in equation (14) as follows:

$$\rho_{r,n}(17_{(10)}) = 2^3 \cdot \pi_3(001) + [[(010+1) \bmod 8_{(10)}] \times$$
$$LUT(001, 3_{(10)})] \bmod 8_{(10)}$$
$$= 100000 + [011 \times 111] \bmod 8_{(10)}$$
$$= 100000 + 101$$
$$= 100101$$
$$= 37_{(10)}$$

The Turbo interleaver function in equation (14) may be used to generate interleaved addresses without pruning. The interleaved addresses generated by equation (14) may not be valid with pruning, and not all integers in the range of 0 to x have valid mappings.

A pruned Turbo interleaver function that can generate valid interleaved addresses for all linear addresses between 0 and x may be denoted as:

$$y = \lambda_{r,n}(x, L) = \rho_{r,n}(v), \quad \text{Eq (15)}$$

where $\lambda_{r,n}(x, L)$ is the pruned Turbo interleaver function and v is a minimum integer such that the range of 0 to v contains exactly x+1 valid mappings.

If $L = 2^{r+n}$, then there are no pruned addresses, and v=x and $\lambda_{r,n}(x, L) = \rho_{r,n}(x)$. However, if $L < 2^{r+n}$, then there are pruned addresses, and the pruned Turbo interleaver function may be expressed as:

$$y = \lambda_{r,n}(x, L) = \rho_{r,n}(x + \tau_{r,n}(x, L)), \quad \text{Eq (16)}$$

where $v = x + \tau_{r,n}(x, L)$ and $\tau_{r,n}(x, L)$ is a minimum number of invalid mappings to be added to x such that the range from 0 to v contains exactly x+1 valid addresses when mapped by the Turbo interleaver function. The pruned Turbo interleaver function may then be implemented with the Turbo interleaver function if $\tau_{r,n}(x, L)$ can be determined.

A sequential pruned Turbo interleaver algorithm, which is also referred to as Algorithm 4, may be implemented with the pseudo-code below:

```
i = 0
τ = 0
while (i ≤ x)
    v = i + τ
    y = 2ⁿ · πᵣ(v mod 2ʳ) + [[(⌊v/2ʳ⌋ + 1) mod 2ⁿ] × LUT(v mod 2ʳ, n)] mod 2ⁿ
    if y ≥ L
        then τ = τ+1
        else λ_{r,n}(i, L) = y
             i = i + 1
    end
end
```

The Turbo interleaver function in equation (14) includes both a bit-reversal function and an LCS function. The number of invalid mappings for the bit-reversal function may be determined as described above for the pruned BRI. The number of invalid mappings for the LCS function may be determined as described below. The result for the LCS function may be combined with the result for the bit-reversal function to determine $\tau_{r,n}(x, L)$.

A linear congruential sequence may be defined by the following recursion:

$$Y_{i+1} = (a \cdot Y_i + c) \bmod m, \text{ for } i \geq 0, \quad \text{Eq (17)}$$

where
- m>0 is a modulus,
- a is a multiplier with 0≤a<m,
- c is an increment with 0≤c≤m, and
- $Y_i$ is the i-th element in the linear congruential sequence.

It can be shown that an LCS generates all integers between 0 and m−1 and has a full period of length m only if the following conditions are satisfied:
1. c and m are relatively prime,
2. (a−1) is a multiple of every prime divisor of m, and
3. if m is a multiple of 4, then (a−1) is a multiple of 4.

The linear congruential sequences for a Turbo interleaver may have fixed parameters of a=1 and $m=2^n$, e.g., as in UMB. Increments c may be odd constants that may be stored in a look-up table. Starting element $Y_0$ in the sequence may be chosen to be equal to c or some other value. This choice of modulus m, multiplier a, and increment c satisfies the three conditions given above. Hence, the linear congruential sequences have a full period. In this case, the sequence elements may be given by $X_i=s(i)$, where $s(\ )$ may be given as follows:

$$s(c,m,x)=c\cdot(x+1) \bmod m, \text{ for } 0 \leq x < m. \quad \text{Eq (18)}$$

Addresses may be generated in hardware according to equation (18) using an n-bit adder and an n×n unsigned multiplier.

Referring to equation (18), of interest are the number of integers between 0 and some $\alpha'$ whose image under equation (18) is between 0 and some $\beta'$, where $\alpha' \geq 0$ and $\beta' \geq 0$. For example, $\alpha'$ may be equal to $x+1$, and $\beta'$ may be equal to the pruned interleaver size L. The number of such integers (i.e., the number of invalid mappings) may be counted directly by stepping through the sequence of values in equation (18) and comparing $s(i)$ to $\beta'$ for all $0 \leq x \leq \alpha'$. This direct method of counting the number of invalid mappings has complexity proportional to x. An algorithm that can efficiently count the number of invalid mappings with complexity proportional to $\log_2(x)$ is described below.

A set I of integers may be defined as follows:

$$I(c,m,\alpha',\beta')=\{x:0\leq x<\alpha', 0\leq s(c,m,x)<\beta', \alpha'\geq 0, \beta'\geq 0\}. \quad \text{Eq(19)}$$

Set I contains all numbers from 0 to $\alpha'-1$ having valid mappings between 0 and $\beta'$ based on the LCS function.

The number of elements in set I may be denoted as $|I|$ and may be given as:

$$|I| = S'(c, m, \alpha', \beta') \quad \text{Eq (20)}$$
$$= S(c, m, \alpha, \beta) + k_1 k_2 m + k_1 \beta + k_2 \alpha,$$

where $$S'(c, m, \alpha', \beta') = \quad \text{Eq (21)}$$
$$\sum_{x=0}^{m-1}\left(\left\lfloor\frac{x-\alpha'}{m}\right\rfloor-\left\lfloor\frac{x}{m}\right\rfloor\right)\cdot\left(\left\lfloor\frac{s(c,m,x)-\beta'}{m}\right\rfloor-\left\lfloor\frac{s(c,m,x)}{m}\right\rfloor\right),$$

$$S(c, m, \alpha, \beta) = \quad \text{Eq (22)}$$
$$\sum_{x=0}^{m-1}\left(\left\lfloor\frac{x-\alpha}{m}\right\rfloor-\left\lfloor\frac{x}{m}\right\rfloor\right)\cdot\left(\left\lfloor\frac{s(c,m,x)-\beta}{m}\right\rfloor-\left\lfloor\frac{s(c,m,x)}{m}\right\rfloor\right),$$

$$\alpha = \alpha' \bmod m, \quad \beta = \beta' \bmod m,$$
$$0 \leq \alpha < m \text{ and } 0 \leq \beta < m,$$
$$k_1 = \left\lfloor\frac{\alpha'}{m}\right\rfloor \text{ and } k_2 = \left\lfloor\frac{\beta'}{m}\right\rfloor.$$

The number of elements in set I may be ascertained by determining the summation for $S(c,m,\alpha,\beta)$ in equation (22). This summation involves integer floor functions and does not have a closed-form expression. Equation (22) may be expressed using a "saw-tooth" function $((x))$ instead of the floor function. The saw-tooth function $((x))$ may be expressed as:

$$((x)) = x - \lfloor x \rfloor - \frac{1}{2} + \frac{1}{2}\delta(x), \quad \text{Eq (23)}$$

and $$\delta(x) = \begin{cases} 0 & x \text{ not integer} \\ 1 & x \text{ integer.} \end{cases} \quad \text{Eq (24)}$$

A generalized Dedekind sum $d(c,m,u)$ may be defined using the saw-tooth function as follows:

$$d(c, m, c_i) = 12 \cdot \sum_{0 \leq j < m}\left(\left(\frac{j}{m}\right)\right)\cdot\left(\left(\frac{c \cdot j + c_i}{m}\right)\right). \quad \text{Eq (25)}$$

Equation (22) may be expressed using the generalized Dedekind sum as follows:

$$S(c, m, \alpha, \beta) = \frac{\alpha\beta}{m} + d'(c, m, c_1, c_2, c_3, c_4) + K, \quad \text{Eq (26)}$$

$$d'(c, m, c_1, c_2, c_3, c_4) = \quad \text{Eq (27)}$$
$$\frac{1}{12}[d(c, m, c_1) - d(c, m, c_2) + d(c, m, c_3) - d(c, m, c_4)],$$

where $c_1=c+\alpha\cdot c-\beta$, $c_2=c+\alpha\cdot c$, $c_3=c$, $c_4=c-\beta$, and K is a constant.

The combination of the four Dedekind sums in equation (27) may be evaluated iteratively in at most $\log_2(m)$ steps, as follows:

$$d'(c, m, c_1, c_2, c_3, c_4) = \sum_{j=1}^{t}\sum_{i=1}^{4}(-1)^{i-j+2}\cdot \quad \text{Eq (28)}$$

$$\left(\frac{b_i[j]\left(\begin{array}{c}c_i[j]+\\c_i[j+1]\end{array}\right)p[j-1]}{2\,h[1]} - \frac{b_i[j]}{2} - \frac{e(h[j+1], c_i[j])}{4}\right)$$

where $$h[j+2] = h[j] \bmod h[j+1],$$
with $h[1] = m$, and $h[2] = c$,
$$c_i[j+1] = c_i[j] \bmod h[j+1], \text{ with } c_i[1] = c_i,$$
$$b_i[j] = \left\lfloor\frac{c_i[j]}{h[j+1]}\right\rfloor,$$
$$p[j] = \left\lfloor\frac{h[j]}{h[j+1]}\right\rfloor \cdot p[j-1] + p[j-2],$$
with $p[0] = 1$ and $p[1] = \left\lfloor\frac{h[1]}{h[2]}\right\rfloor$,
$$e(h, c) = \begin{cases} 1 & \text{if } c \neq 0 \text{ or } c \bmod h = 0 \\ 0 & \text{otherwise,} \end{cases}$$
$i = 1, \ldots, 4, j = 1, \ldots, t, \text{ and } t \leq \log_2(k).$ An efficient algorithm for determining $d'(c,m,c_1,c_2,c_3,c_4)$ for the combination of the four Dedekind sums based on equation (28) is described in Provisional U.S. Application Ser. No. 61/016,045. The combination of the four Dedekind sums may also be efficiently determined using a hardware architecture described in Provisional U.S. Application Ser. No. 61/016,045.

A set of integers $J_{r,n}(\alpha',\beta')$ may be defined as follows:

$$J_{r,n}(\alpha',\beta')=\{0\leq x\leq\alpha':\rho_{r,n}(x)\geq\beta',\alpha'\geq 0,\beta'\geq 0\}. \quad \text{Eq (29)}$$

Set $J_{r,n}(\alpha',\beta')$ contains all integers from 0 to $\alpha'-1$ with invalid mappings so that $\rho_{r,n}(x)\geq\beta'$. $\alpha'$ and $\beta'$ may each be represented with r+n bits. The number of integers in set $J_{r,n}(\alpha',\beta')$ may be denoted as $\mu_{r,n}(x, L)$.

Set $J_{r,n}(\alpha',\beta')$ may be expressed as:

$$J_{r,n}(\alpha',\beta')=H_{r,n}(\alpha',\beta')\cup K_{r,n}(c,\alpha',\beta'), \quad \text{Eq (30)}$$

where $H_{r,n}(\alpha',\beta')$ is a set of integers with invalid mappings determined by considering the bit-reversal function $\pi_r()$ on the r LSBs of x, $K_{r,n}(c,\alpha',\beta')$ is a set of integers with invalid mappings determined by considering the LCS function on the n MSBs of x, and "∪" denotes a union set operation.

Set $H_{r,n}(\alpha', \beta')$ may be defined as follows:

$$H_{r,n}(\alpha', \beta') = \left\{0 \leq x < \alpha' : \pi_r(x \bmod 2^r) > \left\lfloor \frac{\beta'}{2^n} \right\rfloor \right\}. \quad \text{Eq (31)}$$

Set $H_{r,n}(\alpha', \beta')$ includes integer less than $\alpha'$ whose r LSBs, when bit-reversed, form an r-bit number that is greater than a number formed by the r MSBs of $\beta'$.

The number of integers in set $H_{r,n}(\alpha',\beta')$ may be denoted as $\mu_{r,n}'(\alpha',\beta')$ and may be determined as follows:

$$\mu_{r,n}'(\alpha', \beta') = \quad \text{Eq (32)}$$

$$\left\lfloor \frac{\alpha'-1}{2^r} \right\rfloor \cdot \left(2^r - \left\lfloor \frac{\beta'}{2^n} \right\rfloor - 1\right) + \phi_r\!\left((\alpha'-1) \bmod 2^r, \left\lfloor \frac{\beta'}{2^n} \right\rfloor + 1\right).$$

In equation (32), there are $$\left\lfloor \frac{\alpha'-1}{2^r} \right\rfloor$$

full columns each having $$\left(2^r - \left\lfloor \frac{\beta'}{2^n} \right\rfloor - 1\right)$$

invalid mappings. The last column has $$\phi_r\!\left((\alpha'-1) \bmod 2^r, \left\lfloor \frac{\beta'}{2^n} \right\rfloor + 1\right)$$

invalid mappings. $\phi_r()$ may be determined as described above for $\phi()$ for the pruned BRI, with $x=(\alpha'-1) \bmod 2^r$, $$L = \left\lfloor \frac{\beta'}{2^n} \right\rfloor + 1,$$

and $M=2^r$.

Set $K_{r,n}(c,\alpha',\beta')$ may be defined as follows:

$$K_{r,n}(c, \alpha', \beta') = \quad \text{Eq (33)}$$

$$\left\{0 \leq x < \alpha' : \pi_r(x \bmod 2^r) = \left\lfloor \frac{\beta'}{2^n} \right\rfloor, s\!\left(c, 2^n, \left\lfloor \frac{x}{2^r} \right\rfloor\right) \geq \beta' \bmod 2^n \right\}.$$

Set $K_{r,n}(c,\alpha',\beta')$ includes integer less than $\alpha'$ (i) whose r LSBs, when bit-reversed, overlap with the r MSBs of $\beta'$, and (ii) whose n MSBs, when mapped by an LCS function with modulus $2^n$ and an appropriately defined multiplier c, form an n-bit number that is greater than or equal to a number formed by the n LSBs of $\beta'$.

The number of integers in set $K_{r,n}(c, \alpha', \beta')$ may be denoted as $\mu_{r,n}''(c, \alpha', \beta')$ and may be determined as follows:

$$\mu_{r,n}''(\alpha', \beta') = \alpha'' - S'(u, 2^n, \alpha'', \beta''), \quad \text{Eq (34)}$$

where $$u = LUT\!\left(\pi_r\!\left(\left\lfloor \frac{\beta'}{2^n} \right\rfloor\right), n\right), \quad \text{Eq (35)}$$

$$\alpha'' = \left\lfloor \frac{\alpha'+1}{2^r} \right\rfloor + \begin{cases} 1 & \text{if } \pi_r\!\left(\left\lfloor \frac{\beta'}{2^n} \right\rfloor\right) \leq (\alpha'+1) \bmod 2^r \\ 0 & \text{otherwise} \end{cases}, \text{ and} \quad \text{Eq (36)}$$

$$\beta'' = \beta' \bmod 2^n + 1. \quad \text{Eq (37)}$$

$S'(u,2^n, \alpha'', \beta'')$ may be determined as shown in equation (21) and described above.

The total number of integers in set $J_{r,n}(\alpha',\beta')$ may be expressed as:

$$\mu_{r,n}(\alpha',\beta')=\mu_{r,n}'(\alpha',\beta')+\mu_{r,n}''(\alpha',\beta'). \quad \text{Eq (38)}$$

For a pruned Turbo interleaver of length L, where n is the smallest positive integer such that $L \leq 2^{r+n}$, linear address x may be mapped to interleaved address y as follows. First, the number of invalid mappings $\mu_{r,n}^{(1)}(x+1, L)$ in the range of 0 to $x^{(1)}=x$ may be determined based on equation (38), with $\alpha'=x+1$ and $\beta'=L$. The range may then be expanded to $x^{(2)}=x+\mu_{r,n}^{(1)}(x+1, L)$ in order to include the pruned addresses. The number of invalid mappings in the range from 0 to $x^{(2)}$ may then be determined. The process may be repeated until a minimum sized range that includes exactly x+1 valid addresses is reached.

The number of invalid mappings at the (k+1)-th iteration may be given as:

$$x^{(k+1)}=x+\mu_{r,n}^{(k)}(x+1,L), \text{ and} \quad \text{Eq (39)}$$

$$\mu_{r,n}^{(k+1)}(x+1,L)=\mu_{r,n}(x+\mu_{r,n}^{(k)}(x+1,L)+1, L)=\mu_{r,n}(x^{(k+1)}+1,L). \quad \text{Eq (40)}$$

After all iterations are completed, the last value of $\mu_{r,n}^{(k+1)}(x+1, L)$ may be provided as $\tau_{r,n}(x, L)$ in equation (16). Interleaved address y may then be determined based on $\tau_{r,n}(x, L)$ using equations (16).

An algorithm that determines $\tau_{r,n}(x, L)$ iteratively, which is also referred to as Algorithm 5, may be implemented with the pseudo-code below:

```
k = 0
μ_{r,n}^0(x + 1, L) = 0
do {
    μ_{r,n}^{(k+1)}(x + 1, L) = μ_{r,n}(x + μ_{r,n}^{(k)}(x + 1, L) + 1, L)
    k = k + 1
}
while μ_{r,n}^{(k+1)}(x + 1, L) ≠ μ_{r,n}^{(k)}(x + 1, L)
τ_{r,n}(x, L) = μ_{r,n}^{(k+1)}(x + 1, L)
```

An interleaved address y for a linear address x based on the pruned Turbo interleaver function $y=\lambda_{r,n}(x, L)$ with parameter L may be determined as follows. First, an intermediate address v may be computed as follows:

$$v=x+\tau_{r,n}(x,L). \quad \text{Eq (41)}$$

Interleaved address y may then be determined by applying the Turbo interleaver function or $\rho_{r,n}(v)$ on intermediate address v, as follows:

$$y = \rho_{r,n}(v) = \lambda_{r,n}(x,L). \quad \text{Eq (42)}$$

The Turbo interleaver function may be implemented as shown in equation (14) or in some other manner.

Figure 11:
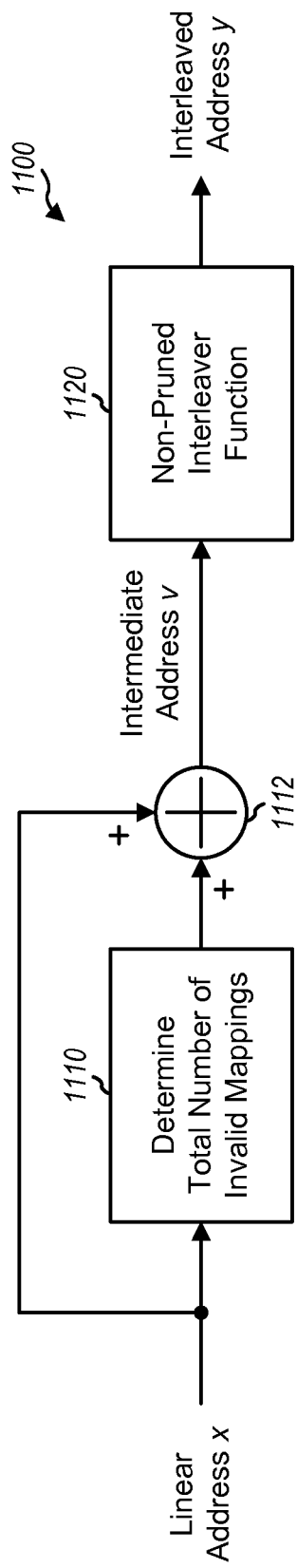
FIG. 11 shows a block diagram of an address generator for a pruned interleaver.

FIG. 11 shows a block diagram of a design of an address generator 1100 for a pruned interleaver, which may be a pruned BRI, a pruned Turbo interleaver, etc. Address generator 1100 may be used for channel interleaver 250 in FIG. 2, Turbo interleaver 320 in FIG. 3, Turbo interleaver 530 in FIG. 5, etc. Within address generator 1100, a unit 1110 receives a linear address x and determines the total number of invalid mappings (e.g., $\phi(x)$ or $\tau_{r,n}(x,L)$) corresponding to x. Unit 1110 may implement Algorithms 2 and 3 for the pruned BRI, Algorithm 5 for the pruned Turbo interleaver, or some other algorithm for other types of interleaver. Unit 1110 may iteratively compute the total number of invalid mappings, as described above.

A summer 1112 sums linear address x with the total number of invalid mappings and provides an intermediate address v. A non-pruned interleaver function 1120 receives intermediate address v and provides an interleaved address y. Function 1120 may implement a bit-reversal function and provide a bit-reversed version of intermediate address v as interleaved address y. Function 1120 may also implement the Turbo interleaver function shown in equation (14), the LCS function shown in equation (17) or (18), or some other interleaver function.

Figure 12:
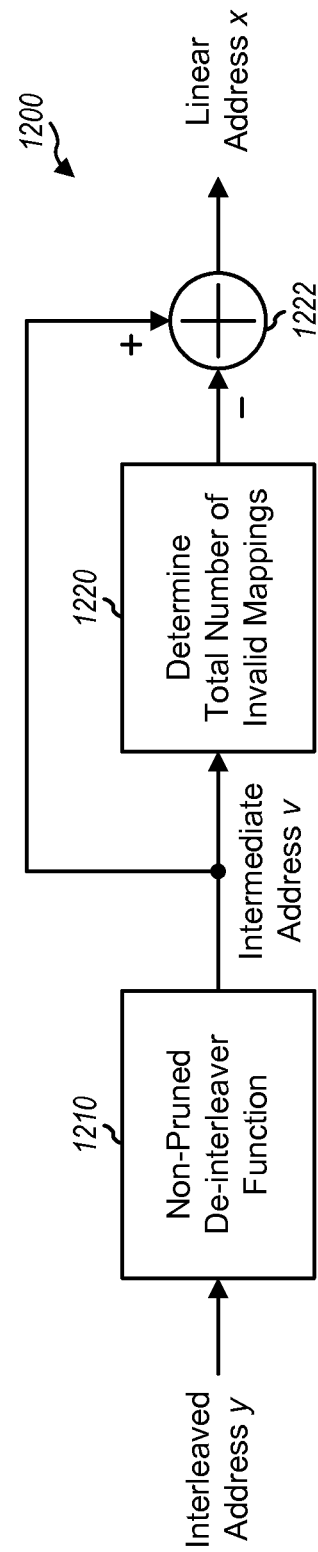
FIG. 12 shows a block diagram of an address generator for a pruned de-interleaver.

FIG. 12 shows a block diagram of a design of an address generator 1200 for a pruned de-interleaver, which may be a pruned bit-reversal de-interleaver, a pruned Turbo de-interleaver, etc. Address generator 1200 may be used for channel de-interleaver 420 in FIG. 4, Turbo de-interleaver 540 in FIG. 5, etc. Within address generator 1200, a non-pruned de-interleaver function 1210 receives an interleaved address y and provides an intermediate address v. Function 1210 may implement a bit-reversal function and provide a bit-reversed version of interleaved address y as intermediate address v. Function 1210 may also implement a Turbo de-interleaver function, an LCS function, or some other de-interleaver function. A unit 1220 receives intermediate address v and determines the total number of invalid mappings corresponding to v, e.g., with just one iteration. Unit 1220 may implement Algorithms 2 and 3 for the pruned bit-reversal de-interleaver, Algorithm 5 for the pruned Turbo de-interleaver, or some other algorithm for other types of de-interleaver. A summer 1222 subtracts the total number of invalid mappings from intermediate address v and provides a linear address x.

Figure 13:
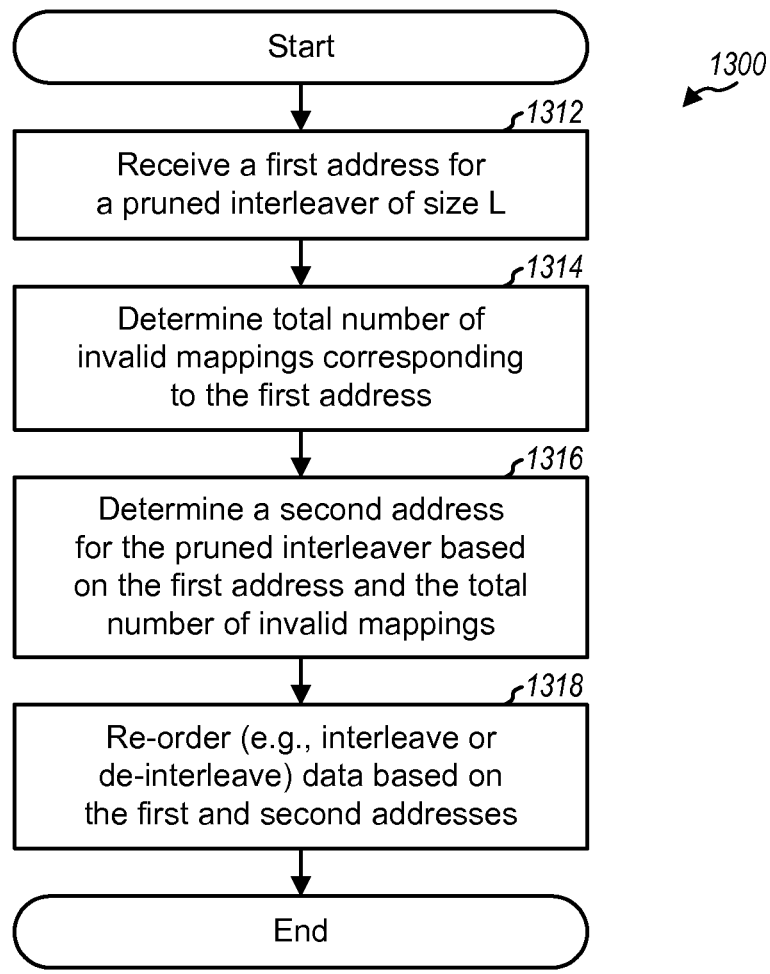
FIG. 13 shows a process for re-ordering data.

FIG. 13 shows a design of a process 1300 for re-ordering data. Process 1300 may be performed by a transmitter for data transmission, a receiver for data reception, or some other entity. Process 1300 may be used for channel interleaving, Turbo interleaving, channel de-interleaving, Turbo de-interleaving, etc.

A first address for a pruned interleaver of size L may be received (block 1312). The total number of invalid mappings (e.g., $\phi(x)$ or $\tau_{r,n}(x, L)$) corresponding to the first address may be determined (block 1314). A second address for the pruned interleaver may then be determined based on the first address and the total number of invalid mappings (block 1316). The first and second addresses may each comprise b bits and may be within a range of 0 to L−1, where (M/2)<L<M and $M=2^b$. b may be equal to n for the pruned BRI or to r+n for the Turbo interleaver. Data may be re-ordered based on the first and second addresses (block 1318).

For interleaving, the first address may comprise a linear address and the second address may comprise an interleaved address. For block 1318, a data value at the linear address may be mapped to the interleaved address to interleave the data. In one design, the pruned interleaver may comprise a pruned bit-reversal interleaver. The interleaved address may then be determined by (i) summing the linear address with the total number of invalid mappings to obtain an intermediate address, and (ii) providing a bit-reversed version of the intermediate address as the interleaved address. In another design, the pruned interleaver may comprise a pruned Turbo interleaver. The interleaved address may then be determined by (i) summing the linear address with the total number of invalid mappings to obtain an intermediate address, and (ii) determining the interleaved address based on a non-pruned interleaver function of the intermediate address. The non-pruned interleaver function may comprise (i) a first mapping function (e.g., a bit-reversal function) for a plurality of rows of an array and (ii) a second mapping function (e.g., an LCS function) for a plurality of entries in each row.

For de-interleaving, the first address may comprise an interleaved address and the second address may comprise a linear address. For block 1318, a data value at the interleaved address may be mapped to the linear address to de-interleave the data. In one design, the pruned interleaver may comprise a pruned bit-reversal interleaver. The linear address may then be determined by (i) determining an intermediate address based on a bit-reversed version of the interleaved address, and (ii) subtracting the total number of invalid mappings from the intermediate address to obtain the linear address. In another design, the pruned interleaver may comprise a pruned Turbo interleaver. The linear address may then be determined by (i) determining an intermediate address based on a non-pruned de-interleaver function of the interleaved address, and (ii) subtracting the total number of invalid mappings from the intermediate address to obtain the linear address.

In one design, the total number of invalid mappings may be determined iteratively, e.g., for a predetermined number of iterations (e.g., n−1 iterations) or until the same total number of invalid mappings is obtained for two consecutive iterations. Each iteration may be performed in different manners for different types of pruned interleaver.

In one design that may be applicable for a pruned BRI and possibly other pruned interleavers, for each iteration k, a temporary address (e.g., $x^{(k)}$) may be determined based on a sum of the first address and an initial value for the iteration. The initial value may be equal to zero for the first iteration or equal to the number of invalid mappings (e.g., $\sigma^{(k-1)}(x)$) from a prior iteration for each subsequent iteration. The number of invalid mappings in a range of zero to the temporary address (e.g., $\sigma^{(k)}(x)$) may then be determined. For the pruned BRI, zero bits in a bit representation of L−1 may be identified. A count value (e.g., $\sigma_i(x)$) for each zero bit in the bit representation of L−1 may be determined based on the temporary address, the bit representation of L−1, and the location of the zero bit in the bit representation of L−1, e.g., as described above. The count values for all zero bits in the bit representation of L−1 may be summed to obtain the number of invalid mappings in the range of zero to the temporary address, e.g., as shown in equation (10).

In one design that may be applicable for a pruned Turbo interleaver and possibly other pruned interleavers, for each iteration k, a temporary address (e.g., $x^{(k)}$) may be determined based on a sum of the first address and an initial value for the iteration. The initial value may be equal to zero for the first iteration and equal to a combined number of invalid mappings (e.g., $\mu_{r,n}^{(k-1)}(x+1, L)$) from a prior iteration for each subsequent iteration. A first number of invalid mappings (e.g., $\mu_{r,n}'(\alpha',\beta')$) in a range of zero to the temporary address may be determined based on a first count function determined by the first mapping function, e.g., as shown in equation (32). A second number of invalid mappings (e.g., $\mu_{r,n}''(\alpha',\beta')$) in the range of zero to the temporary address may be determined based on a second count function determined by the second mapping function, e.g., as shown in equation (34). A combined number of invalid mappings (e.g., $\mu_{r,n}(\alpha',\beta')$) for the iteration may be determined based on the first and second numbers of invalid mappings, e.g., as shown in equation (38). The first count function may be based on a bit-reversal function. The second count function may be based on a LCS function and may comprise a combination of Dedekind sums. The first and second count functions may also be defined in other manners for other mapping functions.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. A method of processing data, comprising:
   receiving a first address for a pruned interleaver;
   determining a total number of invalid mappings corresponding to the first address at least in part by determining a temporary address based on a sum of the first address and an initial value and by determining a first number of invalid mappings in a range of zero to the temporary address, wherein the total number of invalid mappings is determined further based on a combination of Dedekind sums;
   determining a second address for the pruned interleaver based on the first address and the total number of invalid mappings; and
   re-ordering data based on the first and second addresses.

2. The method of claim 1, wherein the first address comprises a linear address and the second address comprises an interleaved address, and wherein the re-ordering data comprises mapping a data value at the linear address to the interleaved address to interleave the data.

3. The method of claim 2, wherein the pruned interleaver comprises a pruned bit-reversal interleaver, and wherein the determining the second address comprises summing the linear address with the total number of invalid mappings to obtain an intermediate address, and providing a bit-reversed version of the intermediate address as the interleaved address.

4. The method of claim 2, wherein the determining the second address comprises summing the linear address with the total number of invalid mappings to obtain an intermediate address, and determining the interleaved address based on a non-pruned interleaver function of the intermediate address.

5. The method of claim 4, wherein the non-pruned interleaver function comprises a first mapping function for a plurality of rows of an array and a second mapping function for a plurality of entries in each row.

6. The method of claim 4, wherein the non-pruned interleaver function comprises a bit-reversal function and a linear congruential sequence (LCS) function.

7. The method of claim 1, wherein the first address comprises an interleaved address and the second address comprises a linear address, and wherein the re-ordering data comprises mapping a data value at the interleaved address to the linear address to de-interleave the data.

8. The method of claim 7, wherein the pruned interleaver comprises a pruned bit-reversal interleaver, and wherein the determining the second address comprises determining an intermediate address based on a bit-reversed version of the interleaved address, and subtracting the total number of invalid mappings from the intermediate address to obtain the linear address.

9. The method of claim 7, wherein the determining the second address comprises determining an intermediate address based on a non-pruned de-interleaver function of the interleaved address, and subtracting the total number of invalid mappings from the intermediate address to obtain the linear address.

10. The method of claim 1, wherein the total number of invalid mappings is determined iteratively.

11. The method of claim 10, wherein the total number of invalid mappings is determined for a predetermined number of iterations or until the same total number of invalid mappings is obtained for two consecutive iterations.

12. The method of claim 10, wherein the initial value is equal to zero for the first iteration and is equal to the first number of invalid mappings from a prior iteration for each subsequent iteration.

13. The method of claim 10, wherein the pruned interleaver has a size of L, and wherein the determining the first number of invalid mappings in the range of zero to the temporary address comprises:

identifying zero bits in a bit representation of L−1, determining a count value for each zero bit in the bit representation of L−1 based on the temporary address, the bit representation of L−1, and location of the zero bit in the bit representation of L−1, and summing count values for all zero bits in the bit representation of L−1 to obtain the first number of invalid mappings in the range of zero to the temporary address.

14. The method of claim 5, wherein the determining the total number of invalid mappings further comprises:

determining the first number of invalid mappings for the first address based on the first mapping function, determining a second number of invalid mappings for the first address based on the second mapping function, and determining the total number of invalid mappings based on the first and second numbers of invalid mappings.

15. The method of claim 5, wherein the total number of invalid mappings is determined iteratively, and wherein the determining the total number of invalid mappings comprises, for each iteration, determining the temporary address based on a sum of the first address and an initial value for the iteration, determining the first number of invalid mappings in a range of zero to the temporary address based on a first count function determined by the first mapping function, determining a second number of invalid mappings in the range of zero to the temporary address based on a second count function determined by the second mapping function, and determining a combined number of invalid mappings for the iteration based on the first and second numbers of invalid mappings.

16. The method of claim 15, wherein the initial value is equal to zero for the first iteration and is equal to the combined number of invalid mappings from a prior iteration for each subsequent iteration.

17. The method of claim 15, wherein the first count function is determined based on a bit-reversal function for the first mapping function.

18. The method of claim 15, wherein the second count function is determined based on a linear congruential sequence (LCS) function for the second mapping function.

19. The method of claim 15, wherein the second count function comprises the combination of Dedekind sums.

20. The method of claim 1, wherein the first and second addresses each comprises b bits and is within a range of 0 to L−1, where L is the size of the pruned interleaver, with (M/2)<L<M and M=2b.

21. An apparatus for processing data, comprising:

at least one processor configured to receive a first address for a pruned interleaver, to determine a total number of invalid mappings corresponding to the first address at least in part by determining a temporary address based on a sum of the first address and an initial value and by determining a first number of invalid mappings in a range of zero to the temporary address, to determine a second address for the pruned interleaver based on the first address and the total number of invalid mappings, and to re-order data based on the first and second addresses, wherein the total number of invalid mappings is determined further based on a combination of Dedekind sums.

22. The apparatus of claim 21, wherein the at least one processor is further configured to sum the first address with the total number of invalid mappings to obtain an intermediate address, and to provide a bit-reversed version of the intermediate address as the second address.

23. The apparatus of claim 21, wherein the at least one processor is further configured to sum the first address with the total number of invalid mappings to obtain an intermediate address, and to determine the second address based on a non-pruned interleaver function of the intermediate address.

24. The apparatus of claim 23, wherein the non-pruned interleaver function comprises a bit-reversal function and a linear congruential sequence (LCS) function.

25. The apparatus of claim 21, wherein the pruned interleaver has a size of L, wherein the total number of invalid mappings is determined iteratively, and wherein for each iteration the at least one processor is further configured to identify zero bits in a bit representation of L−I, to determine a count value for each zero bit in the bit representation of L−I based on the temporary address, the bit representation of L−I, and location of the zero bit in the bit representation of L−I, and to sum count values for all zero bits in the bit representation of L−I to obtain the first number of invalid mappings in the range of zero to the temporary address.

26. The apparatus of claim 23, wherein the non-pruned interleaver function comprises a first mapping function for a plurality of rows of an array and a second mapping function for a plurality of entries in each row, and wherein the at least one processor is further configured to determine the total number of invalid mappings iteratively and, for each iteration, to determine the temporary address based on a sum of the first address and an initial value for the iteration, to determine the first number of invalid mappings in a range of zero to the temporary address based on a first count function determined by the first mapping function, to determine a second number of invalid mappings in the range of zero to the temporary address based on a second count function determined by the second mapping function, and to determine a combined number of invalid mappings for the iteration based on the first and second numbers of invalid mappings.

27. The apparatus of claim 21, wherein the apparatus is an integrated circuit.

28. The apparatus of claim 21, wherein the apparatus is a wireless communication device.

29. An apparatus for processing data, comprising:
means for receiving a first address for a pruned interleaver;
one or more circuit means for determining a total number of invalid mappings corresponding to the first address, the one or more circuit means including:
means for determining a temporary address based on a sum of the first address and an initial value; and
means for determining a first number of invalid mappings in a range of zero to the temporary address,
wherein the total number of invalid mappings is determined further based on a combination of Dedekind sums;
means for determining a second address for the pruned interleaver based on the first address and the total number of invalid mappings; and
means for re-ordering data based on the first and second addresses.

30. The apparatus of claim 29, wherein the means for determining the second address comprises
means for summing the first address with the total number of invalid mappings to obtain an intermediate address, and
means for providing a bit-reversed version of the intermediate address as the second address.

31. The apparatus of claim 29, wherein the means for determining the second address comprises
means for summing the first address with the total number of invalid mappings to obtain an intermediate address, and
means for determining the second address based on a non-pruned interleaver function of the intermediate address.

32. The apparatus of claim 31, wherein the non-pruned interleaver function comprises a bit-reversal function and a linear congruential sequence (LCS) function.

33. The apparatus of claim 29, wherein the pruned interleaver has a size of L, wherein the total number of invalid mappings is determined iteratively, and wherein the means for determining the first number of invalid mappings in the range of zero to the temporary address comprises:
means for identifying zero bits in a bit representation of L−1,
means for determining a count value for each zero bit in the bit representation of L−1 based on the temporary address, the bit representation of L−1, and location of the zero bit in the bit representation of L−1, and
means for summing count values for all zero bits in the bit representation of L−1 to obtain the first number of invalid mappings in the range of zero to the temporary address.

34. The apparatus of claim 31, wherein the non-pruned interleaver function comprises a first mapping function for a plurality of rows of an array and a second mapping function for a plurality of entries in each row, wherein the total number of invalid mappings is determined iteratively, and wherein the means for determining the total number of invalid mappings comprises, for each iteration, means for determining a temporary address based on a sum of the first address and an initial value for the iteration,
means for determining a first number of invalid mappings in a range of zero to the temporary address based on a first count function determined by the first mapping function,
means for determining a second number of invalid mappings in the range of zero to the temporary address based on a second count function determined by the second mapping function, and
means for determining a combined number of invalid mappings for the iteration based on the first and second numbers of invalid mappings.

35. A computer program product, comprising:
a non-transitory computer-readable medium comprising:
instructions executable by at least one computer to receive a first address for a pruned interleaver,
instructions executable by the at least one computer to determine a total number of invalid mappings corresponding to the first address at least in part by determining a temporary address based on a sum of the first address and an initial value and by determining a first number of invalid mappings in a range of zero to the temporary address, wherein the total number of invalid mappings is determined further based on a combination of Dedekind sums,
instructions executable by the at least one computer to determine a second address for the pruned interleaver based on the first address and the total number of invalid mappings, and code for causing the at least one computer to re-order data based on the first and second addresses.

36. The method of claim 1, wherein the total number of invalid mappings is determined iteratively, and wherein the determining the total number of invalid mappings comprises, for each iteration,
determining the temporary address based on a sum of the first address and an initial value for the iteration,
determining the first number of invalid mappings in a range of zero to the temporary address based on a first count function determined by a first mapping function,
determining a second number of invalid mappings in the range of zero to the temporary address based on a second count function determined by a second mapping function, the second count function comprising the combination of Dedekind sums, and
determining a combined number of invalid mappings for the iteration based on the first and second numbers of invalid mappings.

37. The method of claim 1, further comprising determining the combination of Dedekind sums.

38. The computer program product of claim 35, wherein the pruned interleaver is associated with a pruned size L and further with a non-pruned size M−1, wherein the total number of invalid mappings reflects mappings from L to M−1, and wherein the non-transitory computer-readable medium further comprises instructions executable by the at least one computer to group the mappings from L to M−1 into multiple integer classes and to determine the first number of invalid mappings based at least in part on one or more of the integer classes.

39. The method of claim 37, wherein the combination of Dedekind sums is determined based on one or more saw-tooth functions.

* * * * *